United States Patent
Cline

(10) Patent No.: US 6,438,718 B1
(45) Date of Patent: Aug. 20, 2002

(54) WORDLINE STRESS MODE ARRANGEMENT A STORAGE CELL INITIALIZATION SCHEME TEST TIME REDUCTION BURN-IN ELIMINATION

(75) Inventor: Danny R. Cline, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/259,798

(22) Filed: Jun. 15, 1994

(51) Int. Cl.$^7$ ............................ G11C 29/00; G11C 7/00
(52) U.S. Cl. ........................................ 714/718; 365/201
(58) Field of Search ............................. 371/21.1, 21.2, 371/21.4; 365/200, 201, 189.01

(56) References Cited

U.S. PATENT DOCUMENTS

| | | | |
|---|---|---|---|
| 4,680,762 A | * 7/1987 | Hardee et al. | 371/20.1 |
| 4,809,231 A | * 2/1989 | Shannon et al. | 365/201 |
| 4,903,265 A | * 2/1990 | Shannan et al. | 371/21.4 |
| 4,956,816 A | * 9/1990 | Atsumi et al. | 365/201 |
| 5,034,923 A | * 7/1991 | Kuo et al. | 365/189.01 |
| 5,208,778 A | * 5/1993 | Kumanoya et al. | 365/201 |
| 5,309,446 A | 5/1994 | Cline et al. | 371/21.1 |
| 5,424,988 A | * 6/1995 | McClure et al. | 365/201 |
| 5,436,910 A | * 7/1995 | Takeshima et al. | 371/21.1 |

* cited by examiner

Primary Examiner—Christine T. Tu
(74) Attorney, Agent, or Firm—W. James Brady, III; Frederick J. Telecky, Jr.

(57) ABSTRACT

An integrated circuit memory device includes a wordline stress mode arrangement and a storage cell initialization arrangement with the array of storage cells. In the wordline stress mode arrangement, a plurality of wordlines are run across the array. Each wordline is connected with the gates of transfer transistors of a different row of the storage cells. A decoder, responsive to a control signal, simultaneously applies a supply voltage to the wordlines. The supply voltage may be provided by a selectable magnitude external source. In the cell initialization arrangement, a plurality of complementary pairs of bitlines are run across the array. Each complementary pair of the bitlines interconnects with the storage cells in a separate column of the array. A precharge circuit is arranged for precharging the bitlines to a precharge voltage. a precharge disabling circuit, responsive to the control signal, disables the precharge circuit from applying the precharge voltage and supplies an alterntive voltage to the pairs of bitlines. A separate amplifier is connected with each separate pair of complementary bitlines. A control circuit, responsive to the control signal, disables operation of the amplifiers when the alternative voltage is supplied to the pairs of bitlines. Considerable testing time can be saved. Burn in stress testing can be eliminated.

10 Claims, 33 Drawing Sheets

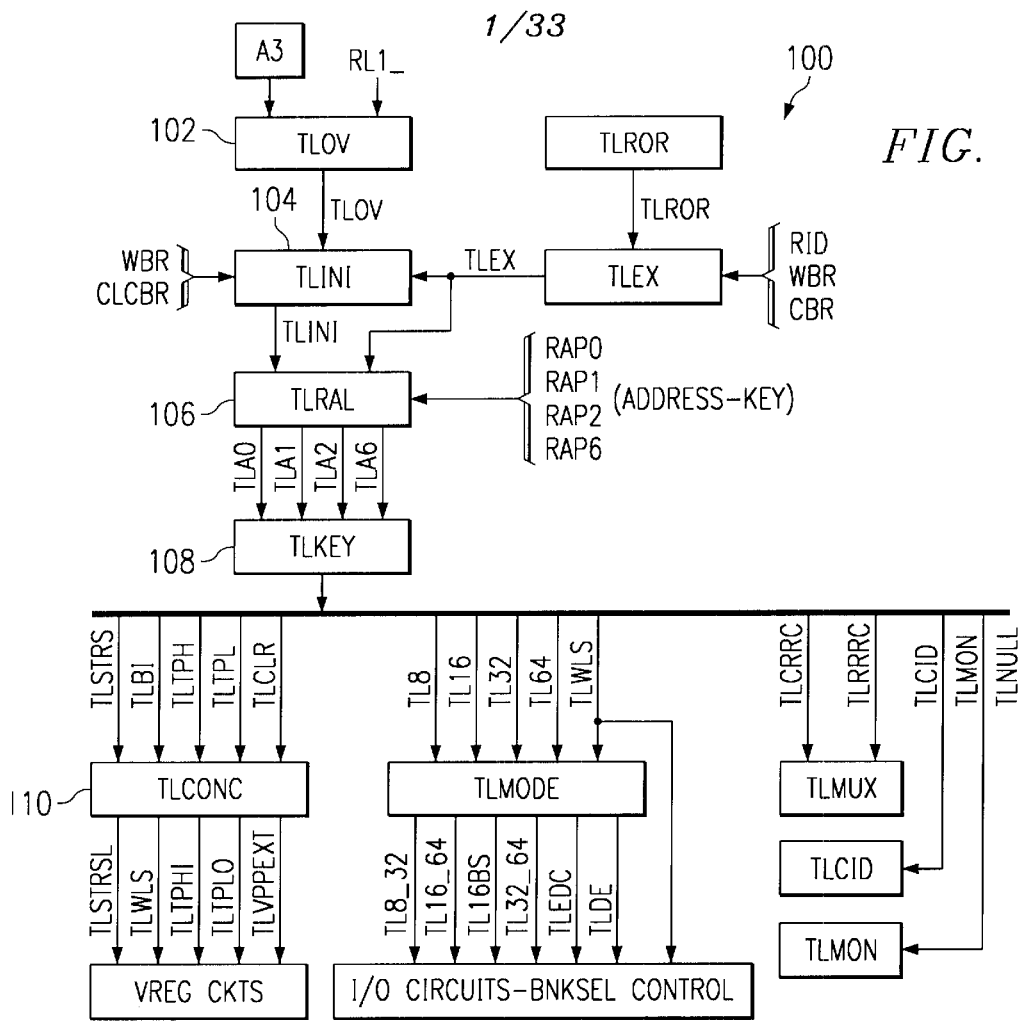
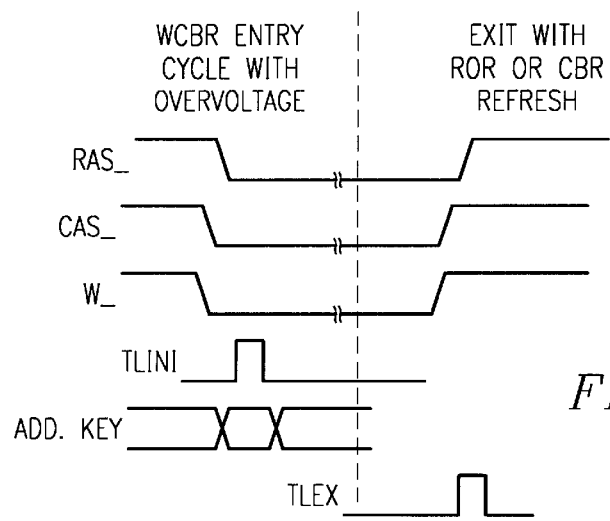

LI_CODE

| M | N | LISLjmki | LIWRjkn | LIENjk | SBSLjkm | LICjmki | LIPjmki | DLjkn |
|---|---|---|---|---|---|---|---|---|
| 0 | 0 | LISLj0k0 | LIWRjk0 | LIENjk | SBSLjk0 | LICj0k0 | LIPj0k0 | DLjk0 |
| 0 | 0 | LISLj0k1 | LIWRjk0 | LIENjk | SBSLjk0 | LICj0k1 | LIPj0k1 | DLjk0 |
| 1 | 0 | LISLj1k0 | LIWRjk0 | LIENjk | SBSLjk1 | LICj1k0 | LIPj1k0 | DLjk0 |
| 1 | 0 | LISLj1k1 | LIWRjk0 | LIENjk | SBSLjk1 | LICj1k1 | LIPj1k1 | DLjk0 |
| 2 | 1 | LISLj2k0 | LIWRjk1 | LIENjk | SBSLjk2 | LICj2k0 | LIPj2k0 | DLjk1 |
| 2 | 1 | LISLj2k1 | LIWRjk1 | LIENjk | SBSLjk2 | LICj2k1 | LIPj2k1 | DLjk1 |
| 3 | 1 | LISLj3k0 | LIWRjk1 | LIENjk | SBSLjk3 | LICj3k0 | LIPj3k0 | DLjk1 |
| 3 | 1 | LISLj3k1 | LIWRjk1 | LIENjk | SBSLjk3 | LICj3k1 | LIPj3k1 | DLjk1 |
| 4 | 2 | LISLj4k0 | LIWRjk2 | LIENjk | SBSLjk4 | LICj4k0 | LIPj4k0 | DLjk2 |
| 4 | 2 | LISLj4k1 | LIWRjk2 | LIENjk | SBSLjk4 | LICj4k1 | LIPj4k1 | DLjk2 |
| 5 | 2 | LISLj5k0 | LIWRjk2 | LIENjk | SBSLjk5 | LICj5k0 | LIPj5k0 | DLjk2 |
| 5 | 2 | LISLj5k1 | LIWRjk2 | LIENjk | SBSLjk5 | LICj5k1 | LIPj5k1 | DLjk2 |
| 6 | 3 | LISLj6k0 | LIWRjk3 | LIENjk | SBSLjk6 | LICj6k0 | LIPj6k0 | DLjk3 |
| 6 | 3 | LISLj6k1 | LIWRjk3 | LIENjk | SBSLjk6 | LICj6k1 | LIPj6k1 | DLjk3 |
| 7 | 3 | LISLj7k0 | LIWRjk3 | LIENjk | SBSLjk7 | LICj7k0 | LIPj7k0 | DLjk3 |
| 7 | 3 | LISLj7k1 | LIWRjk3 | LIENjk | SBSLjk7 | LICj7k1 | LIPj7k1 | DLjk3 |
| 8 | 0 | LISLj8k0 | LIWRjk0 | LIENjk | SBSLjk8 | LICj8k0 | LIPj8k0 | DLjk0 |
| 8 | 0 | LISLj8k1 | LIWRjk0 | LIENjk | SBSLjk8 | LICj8k1 | LIPj8k1 | DLjk0 |

*FIG. 38*

WORDLINE STRESS MODE ARRANGEMENT A STORAGE CELL INITIALIZATION SCHEME TEST TIME REDUCTION BURN-IN ELIMINATION

CROSS REFERENCE TO A RELATED PATENT APPLICATION

The following commonly assigned patent application and patent are hereby incorporated herein by reference:

| U.S. Pat. No. /Serial No. | Filing/Issue Date | TI Case No. |
| --- | --- | --- |
| 08/119,794 | 09/10/93 | TI-14642B |
| 5,309,446 | 05/03/94 | TI-15382A |

FIELD OF THE INVENTION

This invention relates to testing of integrated circuits and, more particularly, to accelerated voltage testing of integrated circuit devices.

BACKGROUND OF THE INVENTION

Accelerated testing is used commonly when testing integrated circuit devices for determining which devices are expected to fail prematurely during normal use. Accelerating the life of an integrated circuit device is a function of a stress voltage, a temperature at which the device is stressed, and a time duration that the device is subjected to the stress condition.

Generally during testing procedures, the various circuit elements are stressed sequentially in patterns and groups. For example, in testing dynamic random access memory (DRAM) devices, it is common to assert only four of sixteen thousand wordlines at a time for stress testing. Thus a subset of the circuit elements is stressed for a period and then another subset is tested. A test engineer must accumulate on-time and off-time data relating to all of the circuit elements being tested so that the total time for circuit element stressing can be calculated. This complicates the testing procedure.

Another factor that complicates testing procedures is a need to stress transfer device gate insulators by applying a difference of potential between bitlines and wordlines. Generally the bitlines are paired as complementary signal pairs, each lead of pair is connected to a different output of a sense amplifier. For a stress condition to be placed on a single transfer device, its wordline is asserted to a high stable voltage, an "on" state, and the associated bitline is driven to a low voltage. For a given test cycle and because of the complementary pairs of bitlines, the test procedure can stress only the circuit devices connected either to the true or the complement side of the bitlines.

Thus integrated circuit devices have required a large amount of time for stress testing procedures. Only a few wordlines are asserted and at most half of the bitlines are driven to the desired voltage level.

SUMMARY OF THE INVENTION

These and other problems are solved by either a wordline stress arrangement or a cell initialization arrangement included in an array of storage cells.

In the wordline stress arrangement, a plurality of wordlines are run across the array. Each wordline is connected with the gates of transfer transistors of a row of the storage cells. A decoder, responsive to a control signal, simultaneously applies a supply voltage to the wordlines.

The supply voltage may be provided by a selectable magnitude external source.

In the cell initialization arrangement, a plurality of complementary pairs of bitlines are run across the array. Each complementary pair of the bitlines interconnects with the storage cells in a separate column of the array. A precharge circuit is arranged for precharging the bitlines to a precharge voltage. A precharge disabling circuit, responsive to the control signal, disables the precharge circuit from applying the precharge voltage and supplies an alternative voltage to the pairs of bitlines. A separate amplifier is connected with each separate pair of complementary bitlines. A control circuit, responsive to the control signal, disables operation of the amplifiers when the alternative voltage is supplied to the pairs of bitlines.

These wordline stress and cell initialization arrangements enable very significant test time saving procedures to be undertaken for the purpose of accelerated voltage testing of integrated circuit devices.

Burn-in stress testing can be eliminated for determining integrated circuit devices that are likely to fail prematurely during normal use.

BRIEF DESCRIPTION OF THE DRAWINGS

The aforementioned invention may be better understood by reading the subsequent detailed description of an illustrative embodiment thereof with reference to the drawings wherein:

FIG. 1 is a block diagram of a design for test arrangement for an integrated circuit memory device;

FIG. 2 is a timing diagram for the design for test arrangement of FIG. 1;

FIG. 38 is a local I/O decoding table for FIGS. 36 and 37; and

DETAILED DESCRIPTION

Figure 3:
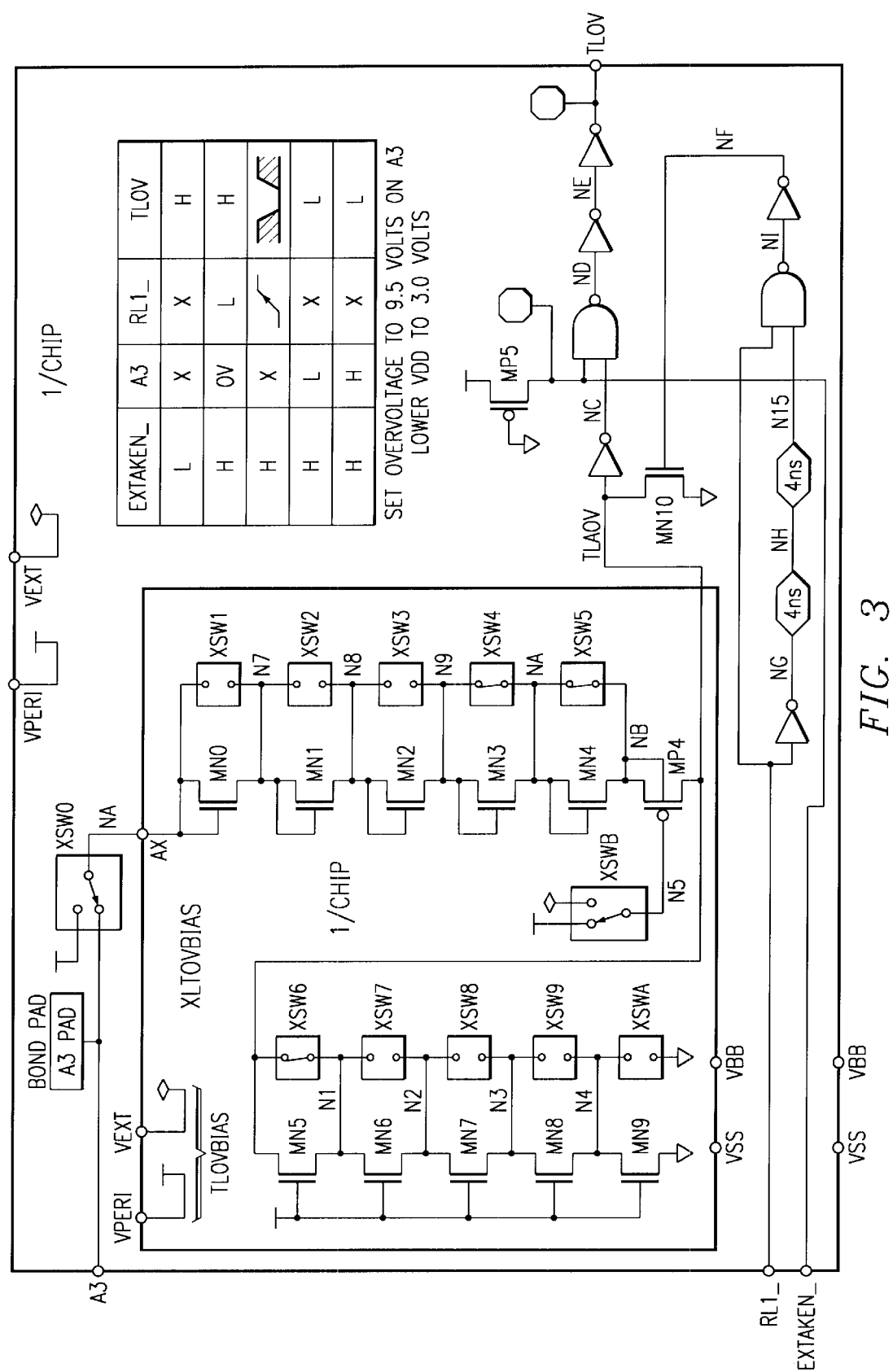
FIG. 3 is a test logic over voltage detector circuit used in the design for test arrangement of FIG. 1.
Figure 4:
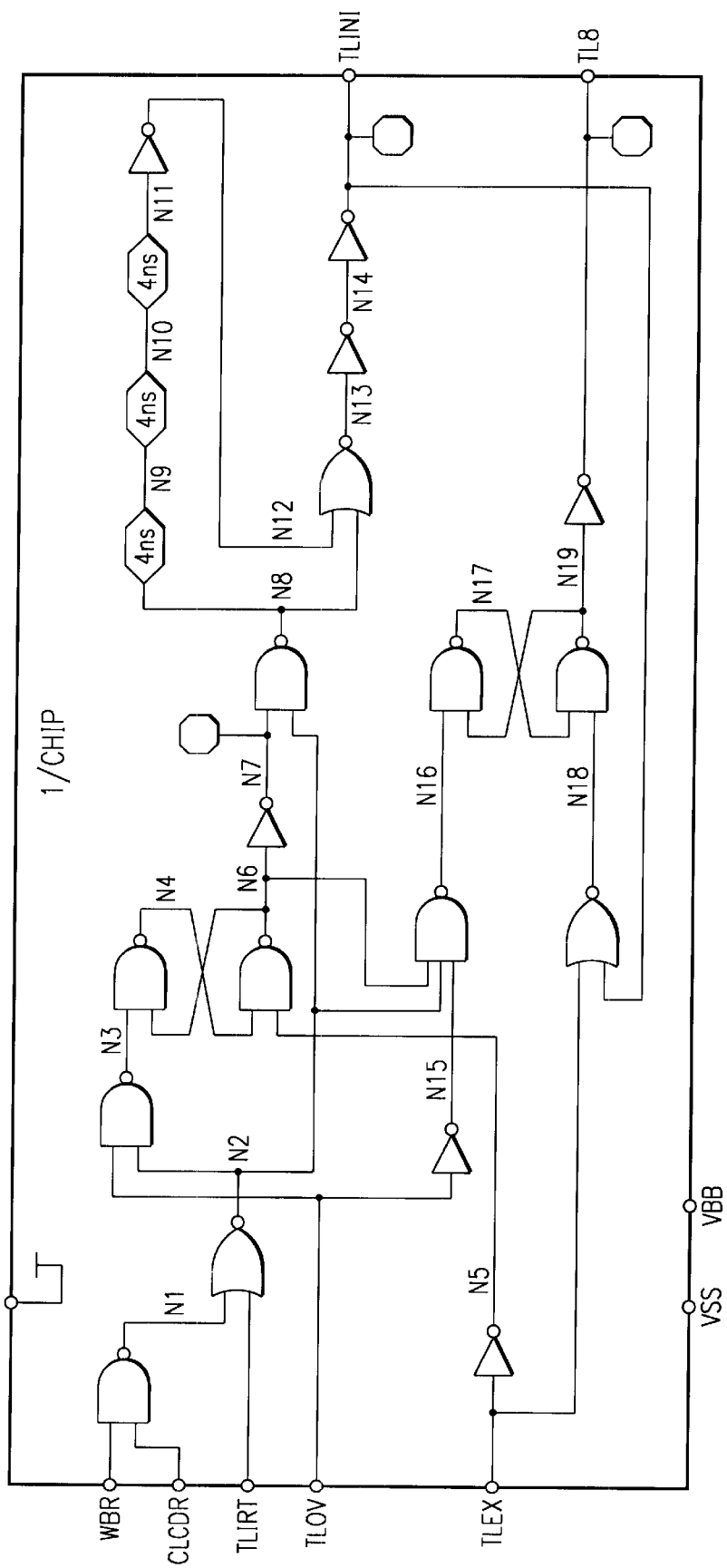
FIG. 4 is a test logic initiate pulse and JEDEC select circuit used in the design for test arrangement of FIG. 1.
Figure 5:
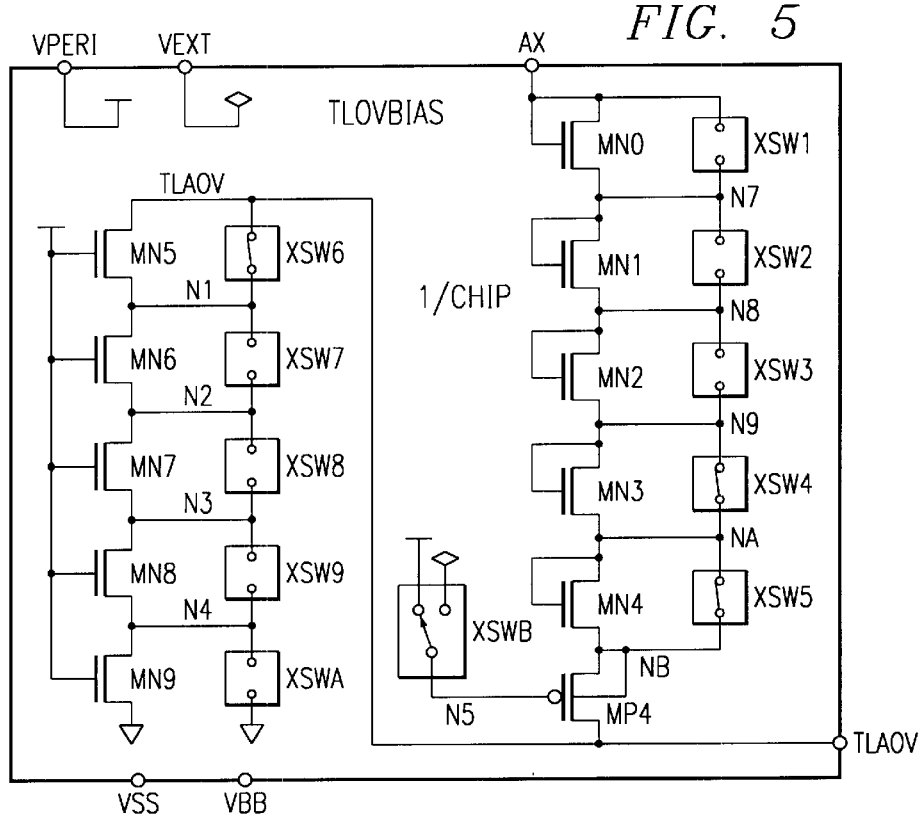
FIG. 5 is a test logic over voltage bias circuit used in the design for test arrangement of FIG. 1.
Figure 6:
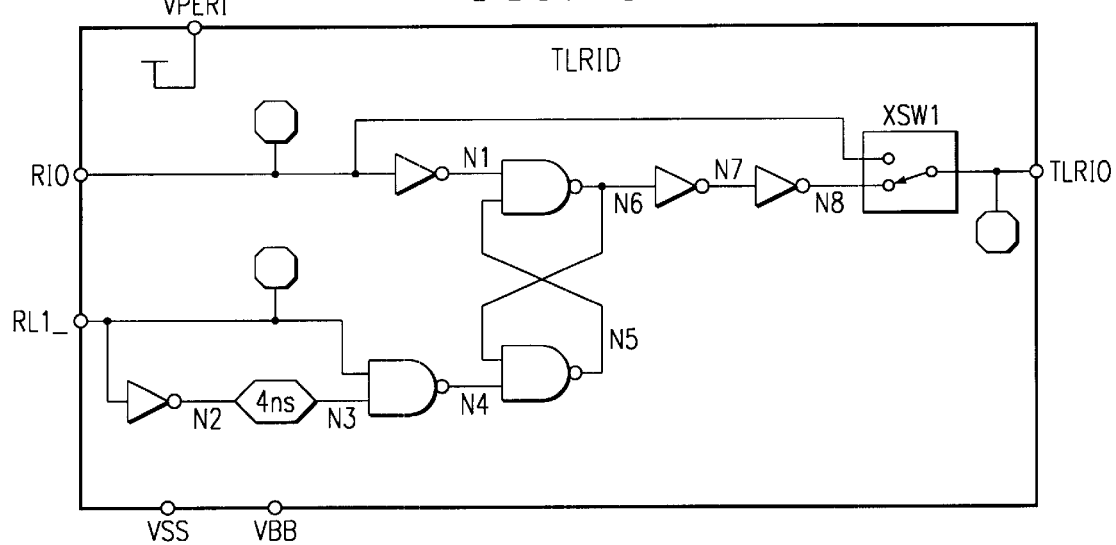
FIG. 6 is a test logic RAS Input Detection circuit used in the design for test arrangement of FIG. 1.
Figure 7:
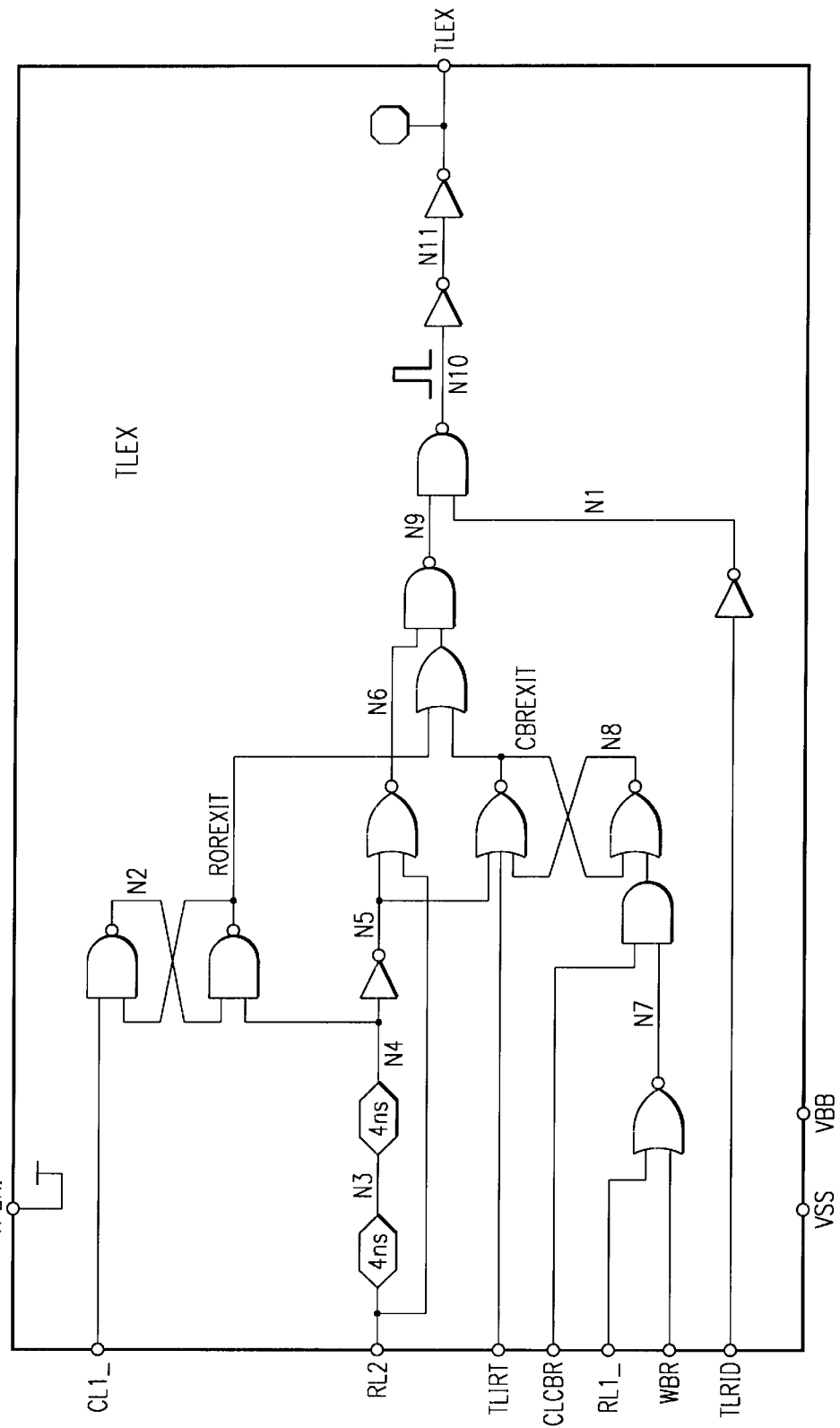
FIG. 7 is a test logic exit circuit used in the design for test arrangement of FIG. 1.
Figure 8:
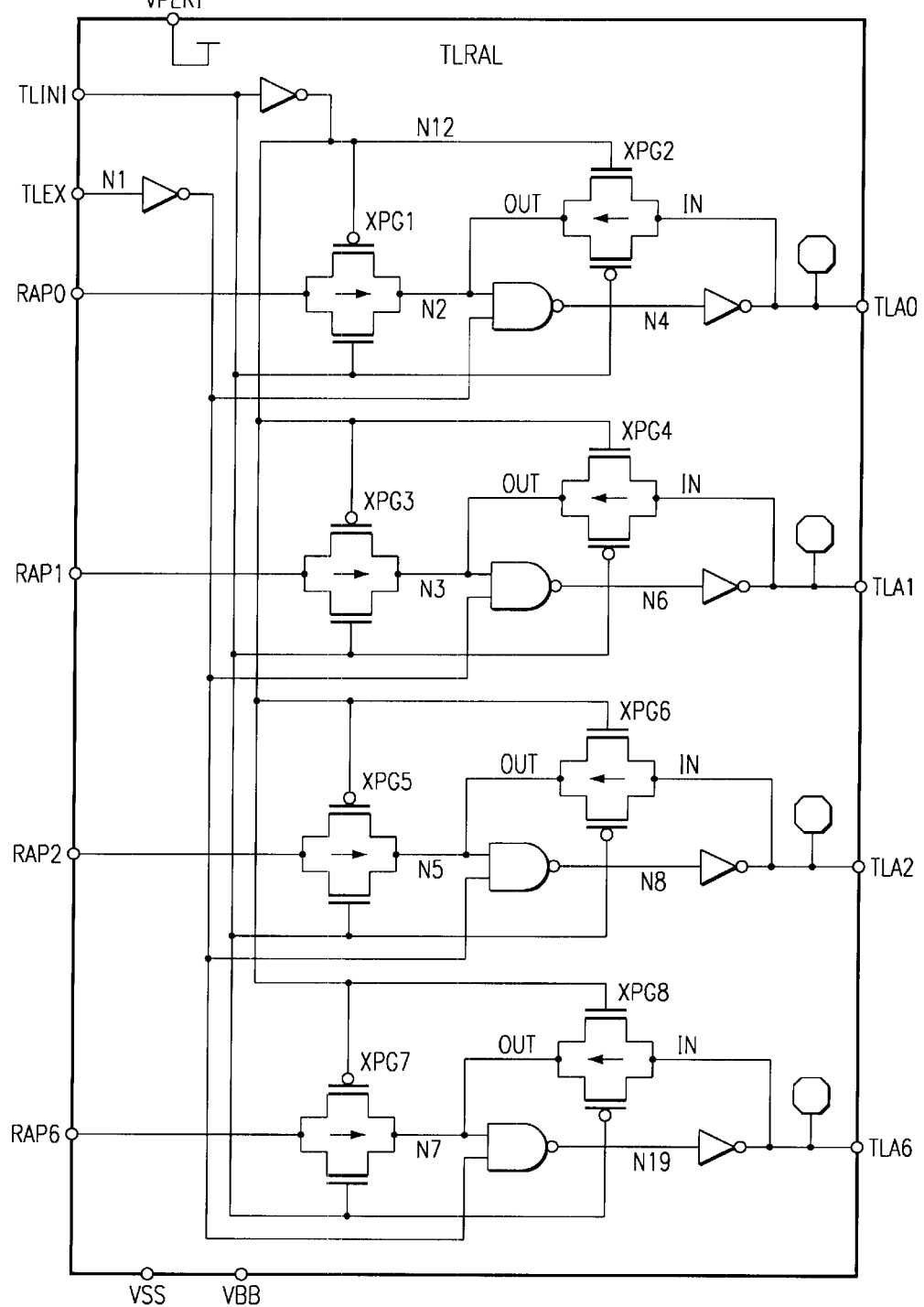
FIG. 8 is a test logic row address latch circuit used in the design for test arrangement of FIG. 1.
Figure 9:
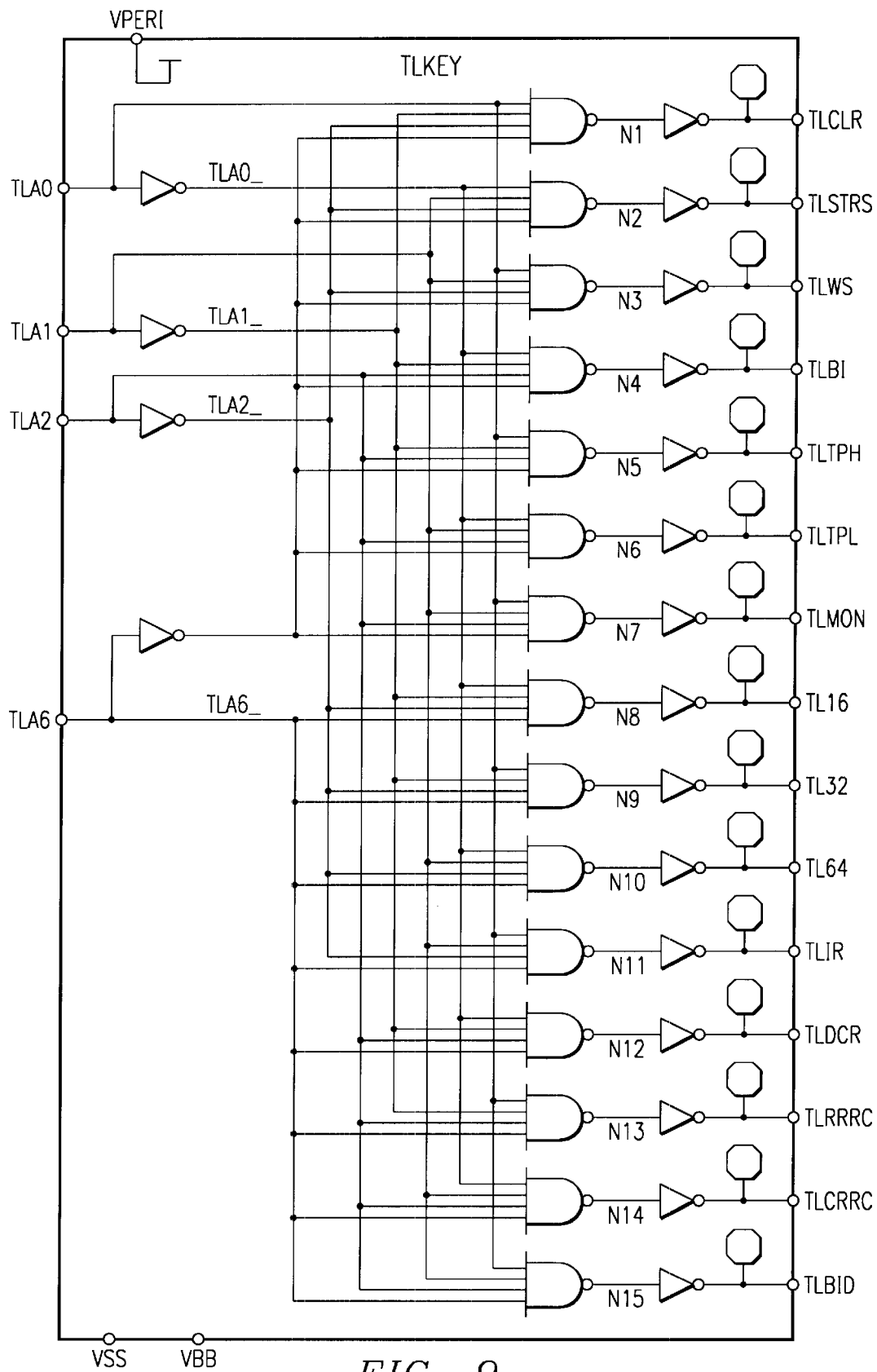
FIG. 9 is a test logic address key decoder circuit used in the design for test arrangement of FIG. 1.

Referring now to FIG. 1, there is shown a block diagram 100 of test mode entry and decoding control logic circuits in a design for test arrangement of an integrated circuit memory device. An overvoltage condition, applied to an address pin A3 when the row logic signal $\overline{RL1}$ is low, causes a test logic overvoltage detector 102 to generate a high logic level signal TLOV. The signal TLOV is generated when the voltage on the address pin A3 is VDD +4.0 volts. This high signal TLOV drives the initiate circuit 104 that detects a write low, CAS before RAS (WCBR) timing set to signify test mode entry. As a result the initiate circuit 104 produces a high level initiate signal TLINI that enables a test logic row address latch 106. Latch 106 decodes an address key RAP0, RAP1, RAP2, OR RAP6 from N address lines to determine one of $2^N$ test modes. An encoded four bit test mode TLA0, TLA1, TLA2, AND TLA6 is latched within the test logic row address latch 106. The resulting output signals TLA0, TLA1, TLA2, TLA6 remain valid until a new test mode is asserted. The encoded four bit test mode TLA0, TLA1, TLA2, and TLA6 is decoded in the test logic key circuit 108 to generate the desired control signals for test mode activation.

Figure 10:
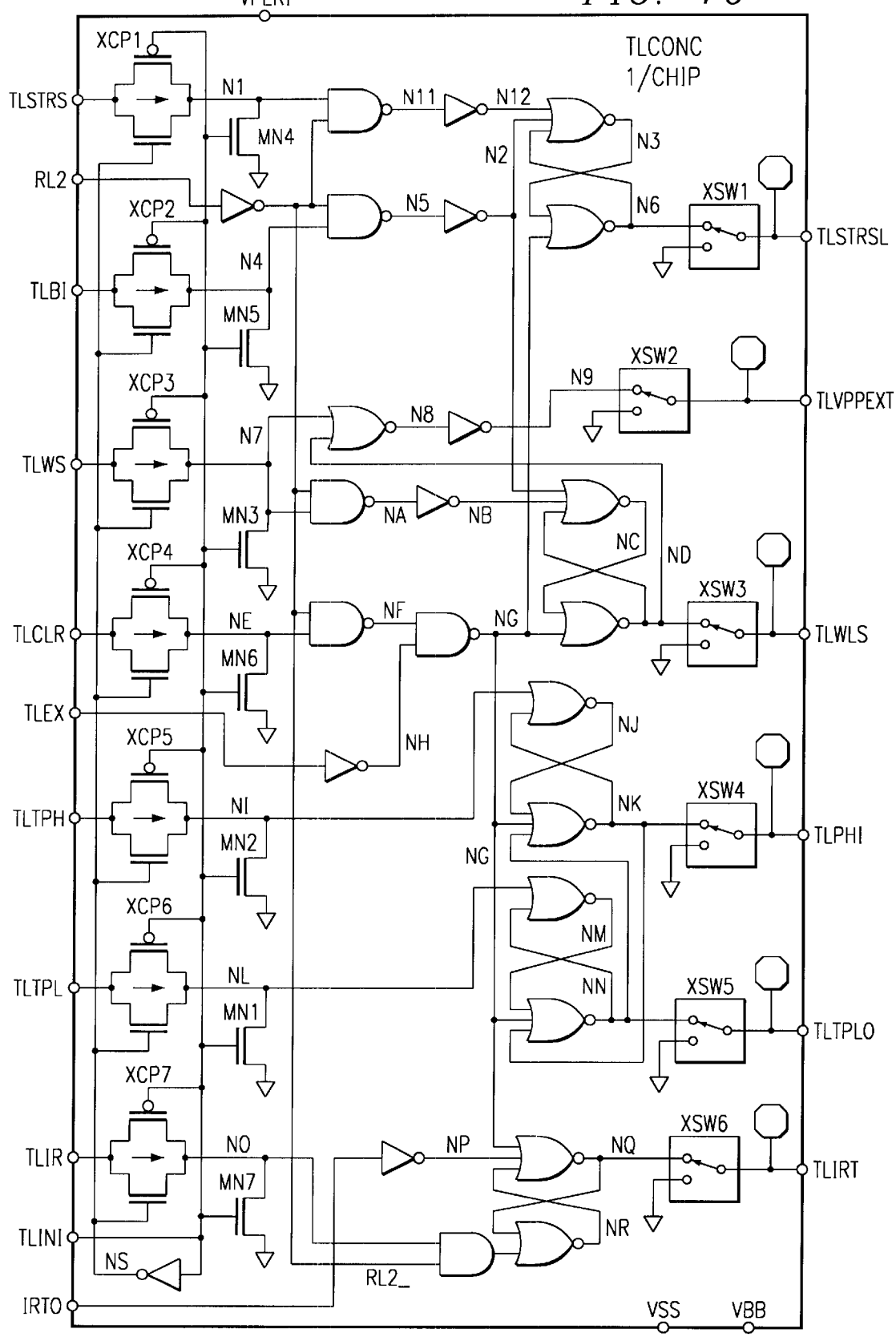
FIG. 10 is a test logic concurrent test mode latches circuit used in the design for test arrangement of FIG. 1.
Figure 11:
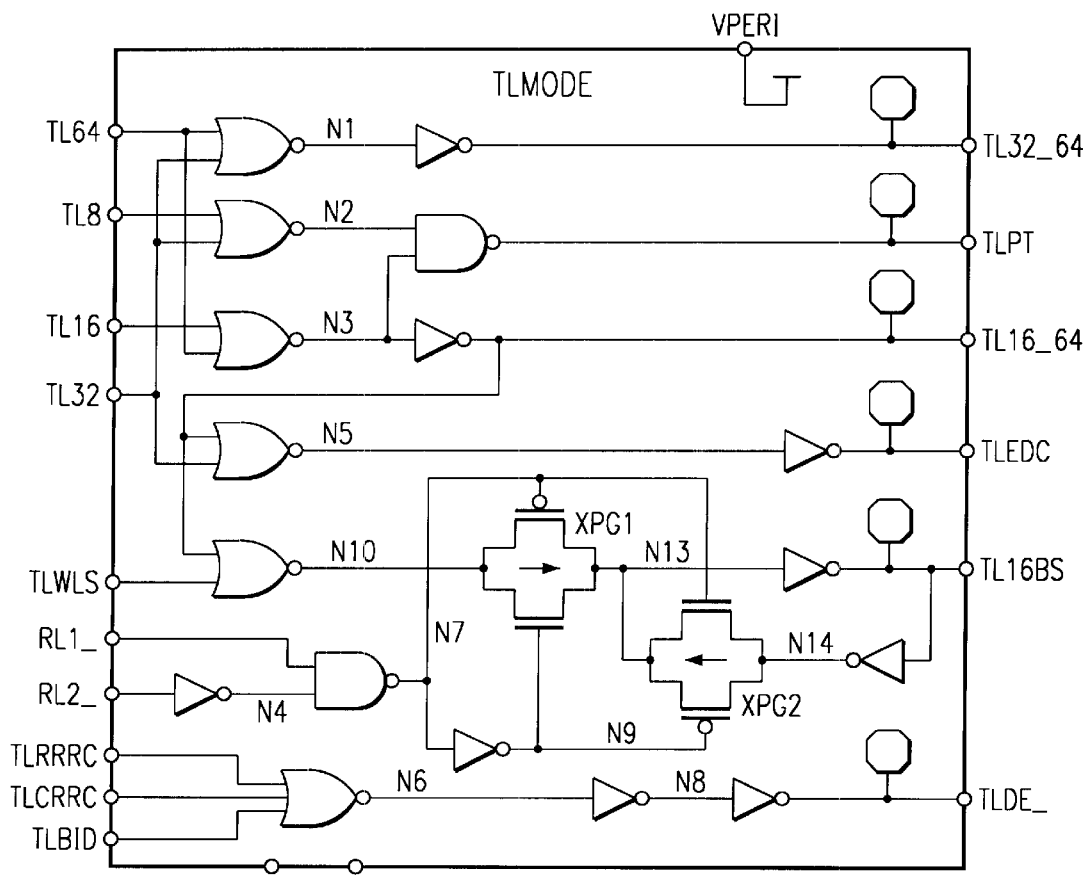
FIG. 11 is a test logic mode decoder circuit used in the design for test arrangement in FIG. 1.
Figure 12:
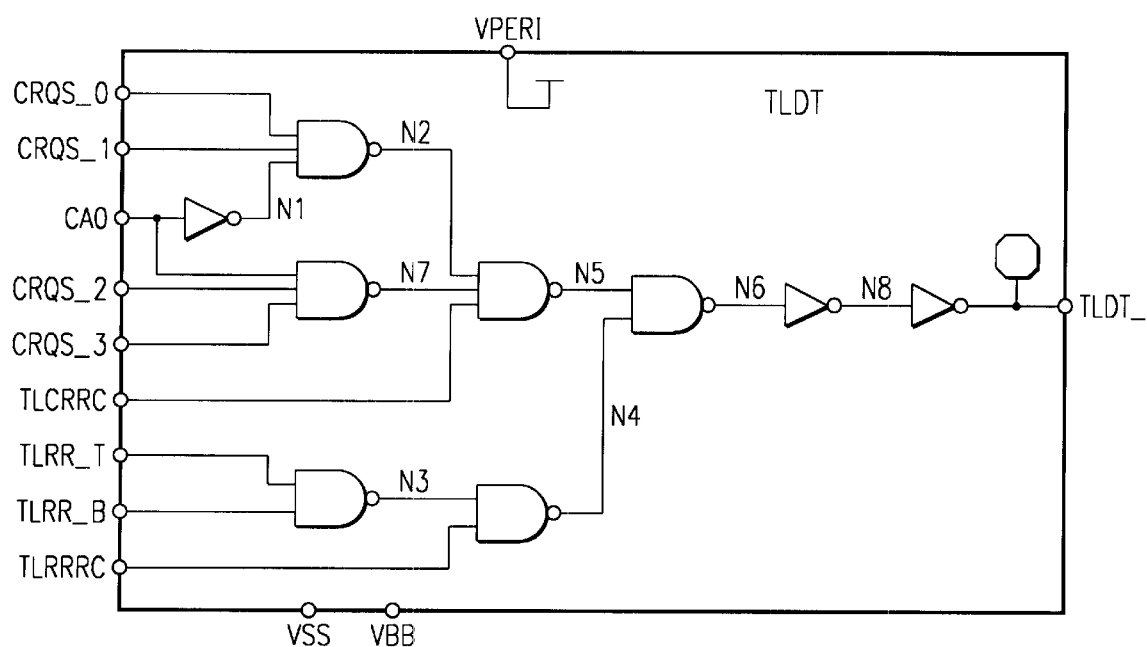
FIG. 12 is a test logic data true circuit used in the design for test arrangement of FIG. 1.
Figure 13:
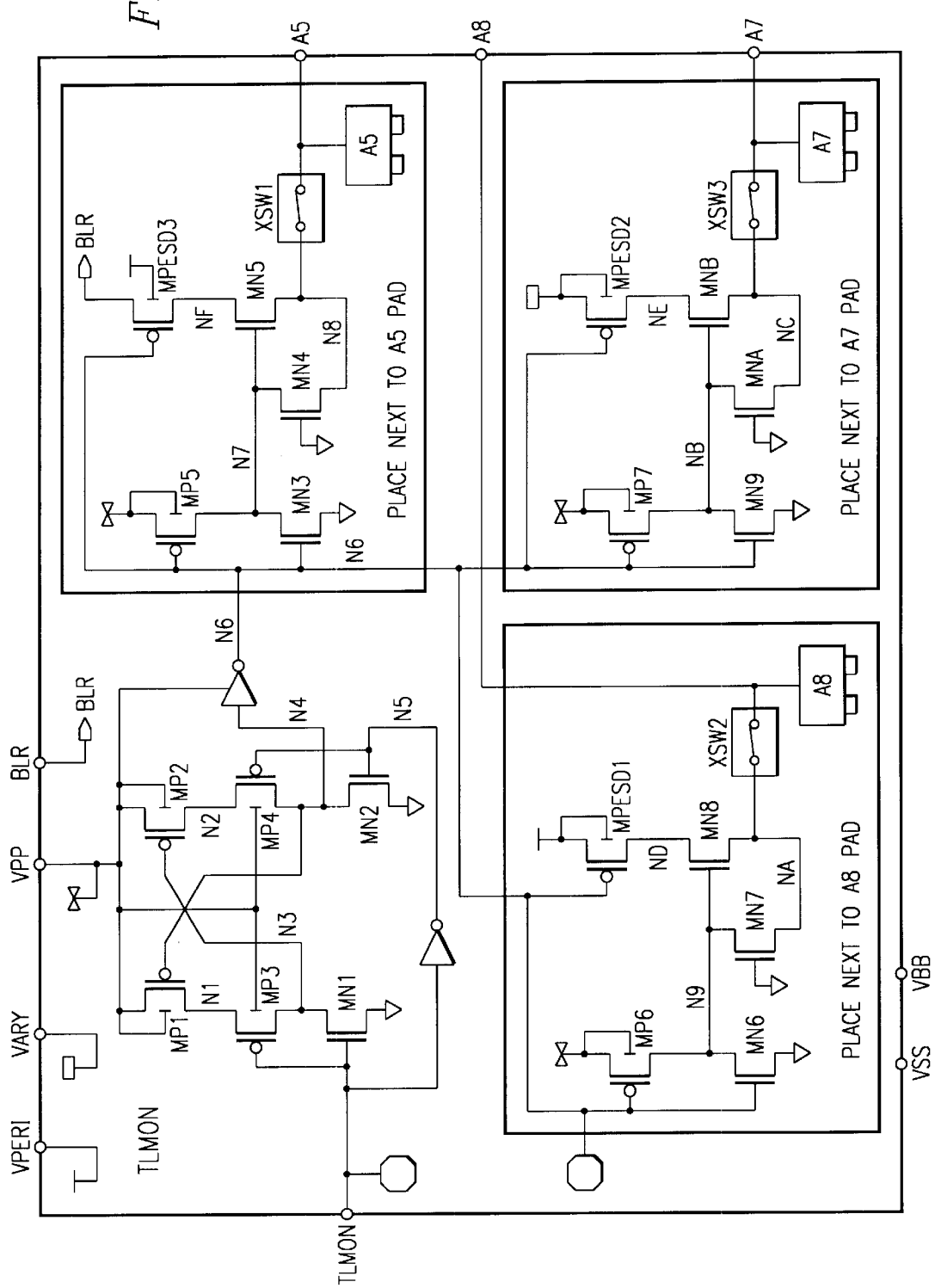
FIG. 13 is a test logic analog monitor circuit used in the design for test arrangement of FIG. 1.
Figure 14:
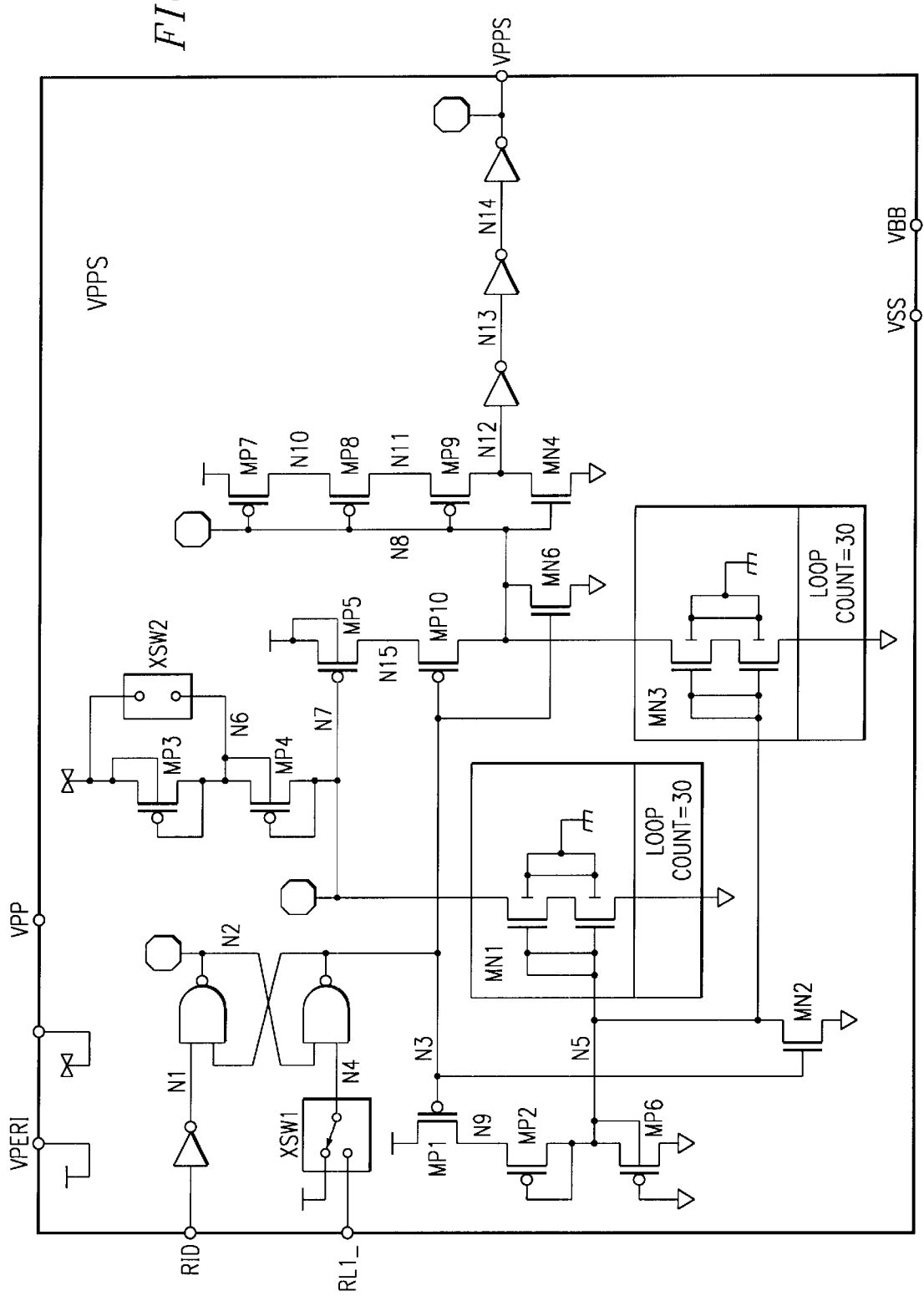
FIG. 14 is a control circuit for the control circuit of FIG. 15 and the arrangement of FIG. 39.

Referring now to FIG. 2, there is shown the write low, CAS before RAS timing sequence, or set, for asserting the test mode. With a test key value of 03Hex and the shown timing the device will enter the wordline stress mode and the signal TLWLS will be asserted high during the next precharge cycle establishing the stress mode on the next cycle. This scheme is preferred to allow normal CAS before RAS (CBR) refresh to occur during the test mode selection cycle. The next cycle will assert the test mode and perform the proper initialization and optional stress mode condition if elevated Vext voltage is applied. The CAS before RAS refresh is normal to all current DRAMs when using this timing set. To preserve the refresh operation, the row logic signal RL2 is used to denote the completion of the entry cycle. The row logic signal RL2 is applied to the test logic concurrent test mode latches TLCONC block shown in FIG. 1 and in FIG. 10. The control signal TLWLS is used to assert the initialization of the cells and allow the optional wordline stress mode to be conducted. The control signal is decoded by the occurrence of "TLWS" and the falling edge of RL2 in block TLCONC (FIG. 10). The mode is retained by the RS latch comprised of XNR4 and XNR5. The signal TLVPPEXT will clamp the internal VPP supply that drives the wordlines to the Vext (external supply) for precise external voltage selection if stressing is desired. A normal supply voltage in this mode will perform a simple clear of all cells and thus provide a quick way to initialize the whole array in one cycle.

Figure 15:
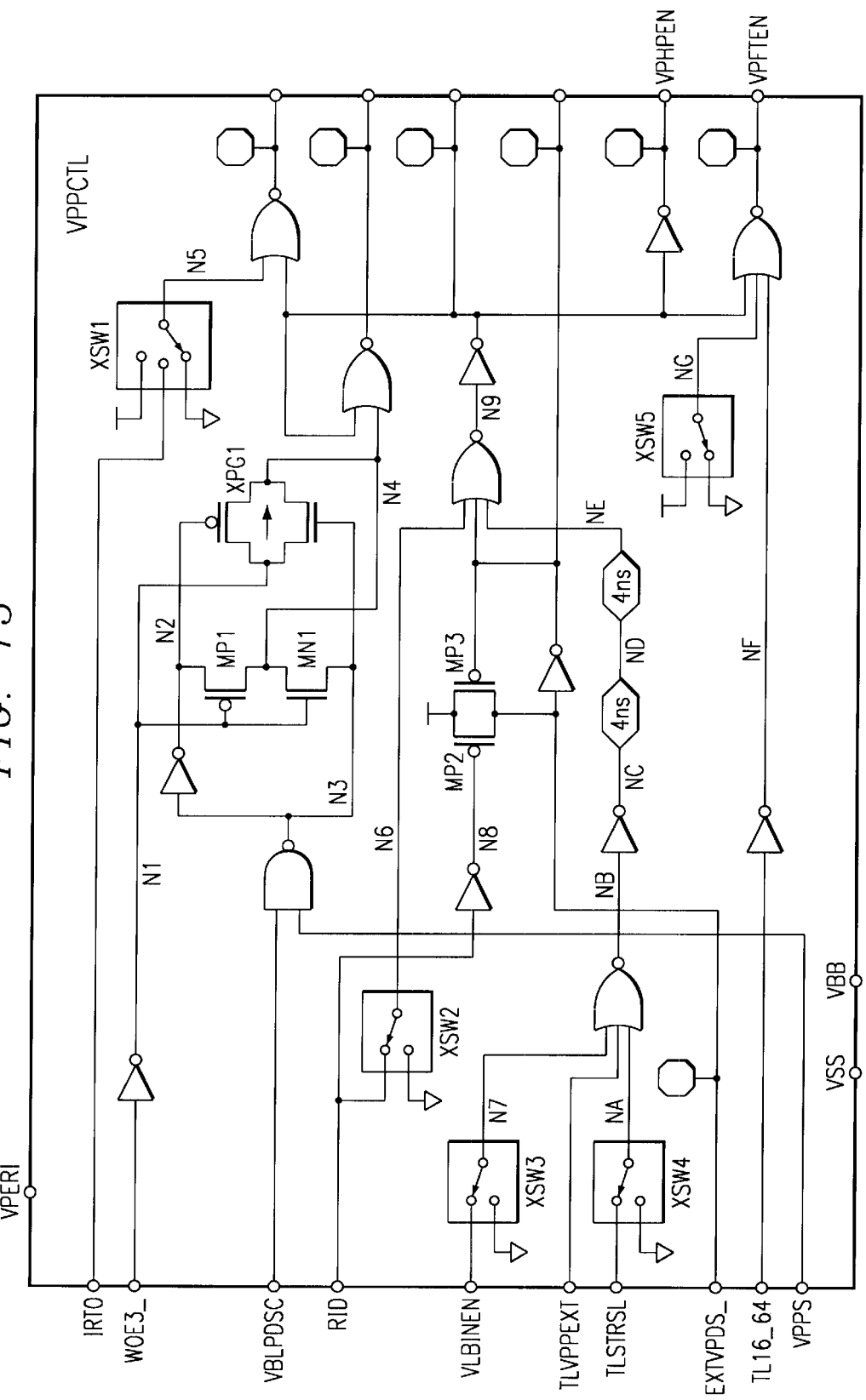
FIG. 15 is a control circuit for the supply circuit of FIG. 16 and the arrangement of FIG. 39.
Figure 16:
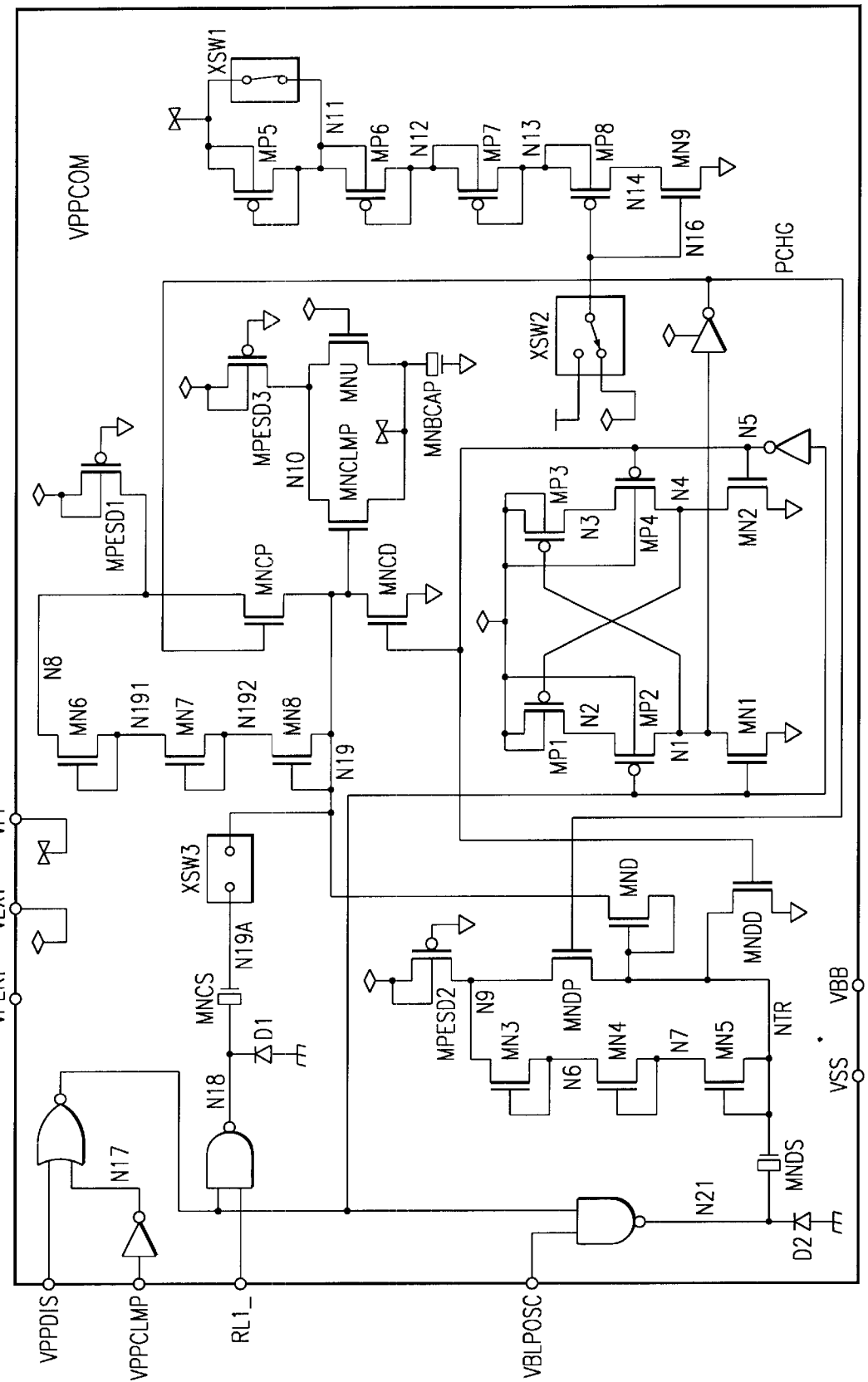
FIG. 16 is a supply circuit for supplying a potential VPP to the row decoders for the arrangement of FIG. 39.
Figure 17:
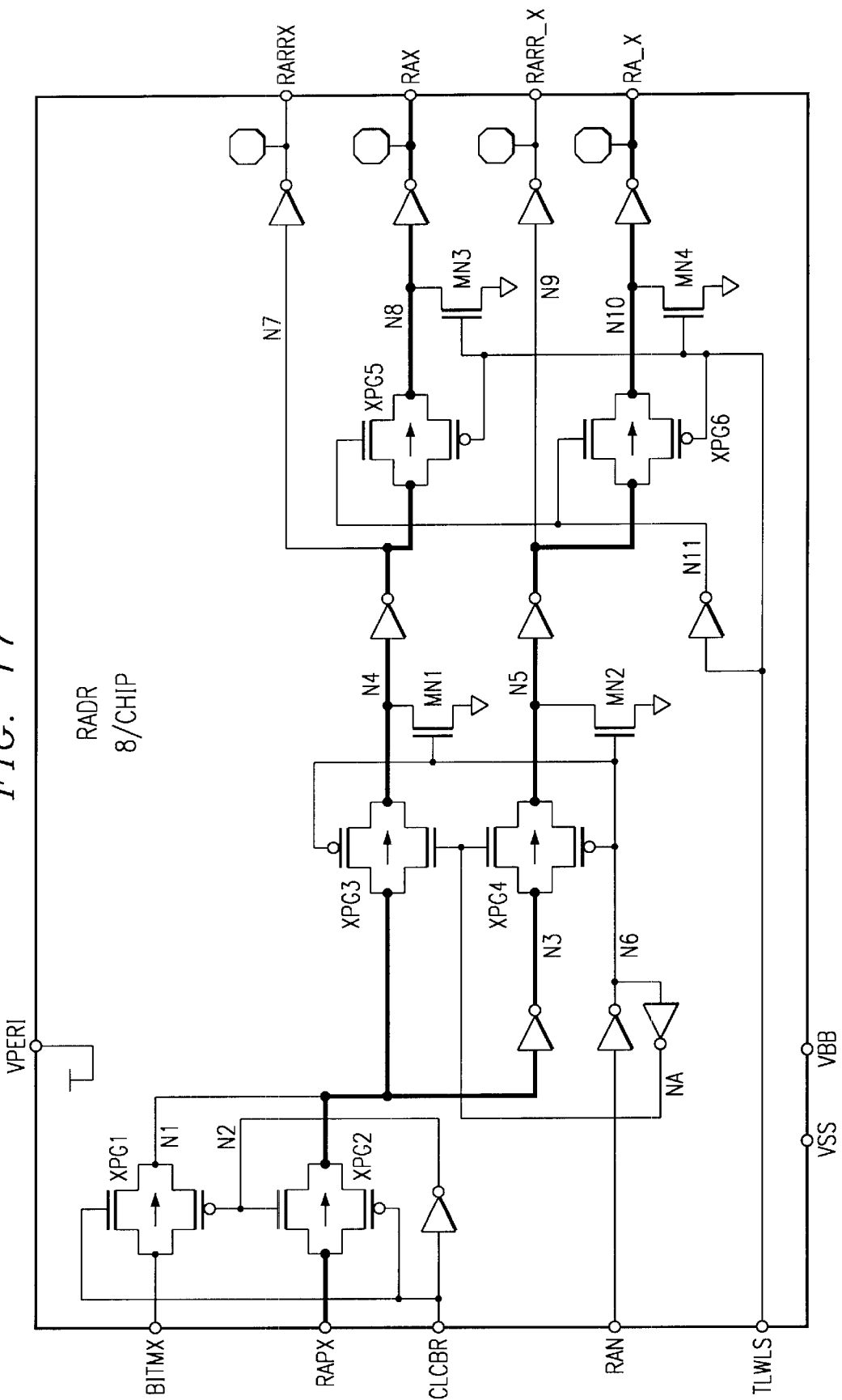
FIG. 17 is a row address driver circuit for the arrangement of FIG. 39.
Figure 18:
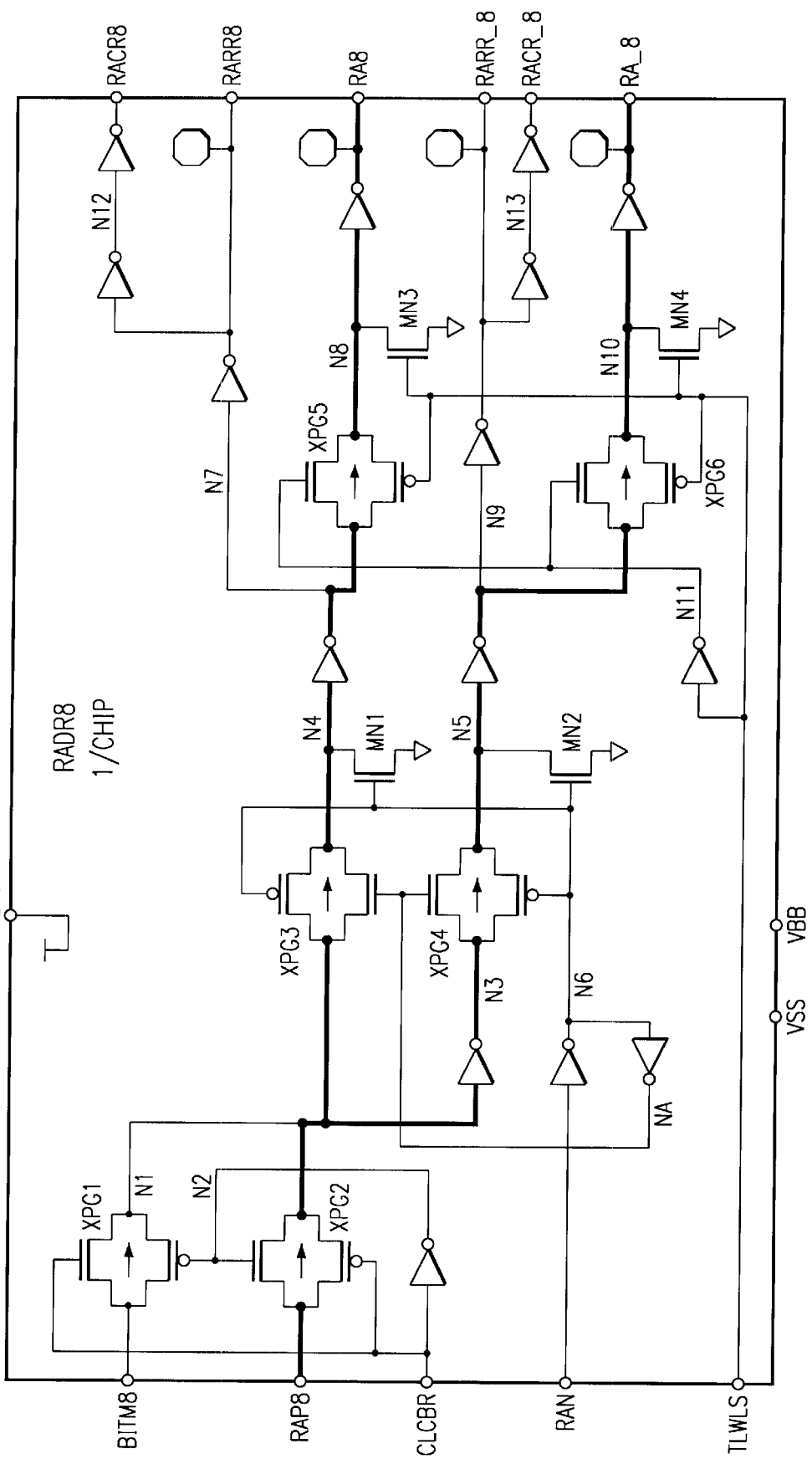
FIG. 18 is a row address driver circuit for the arrangement of FIG. 39.
Figure 19:
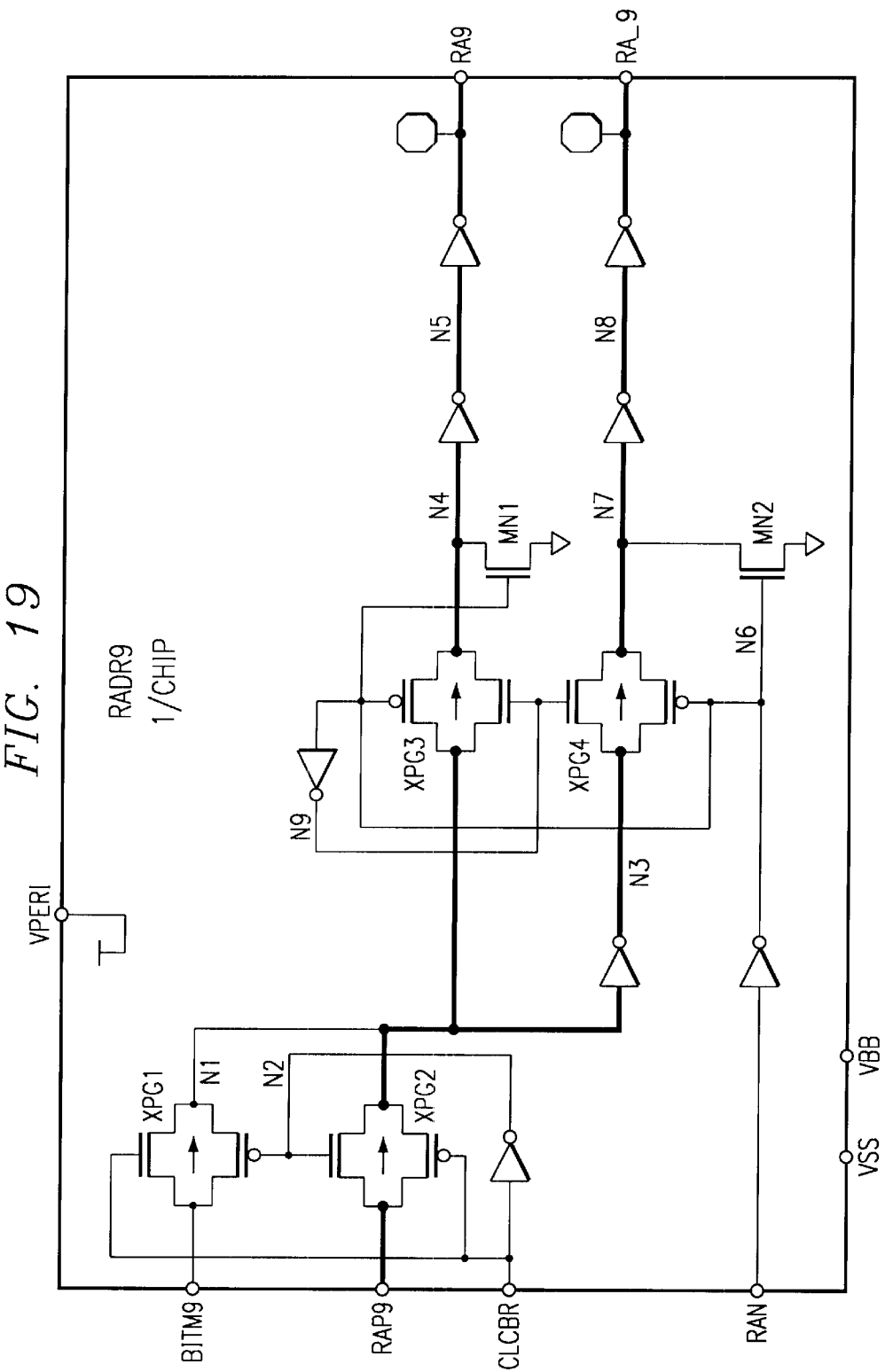
FIG. 19 is a row address driver circuit for the arrangement of FIG. 39.
Figure 20:
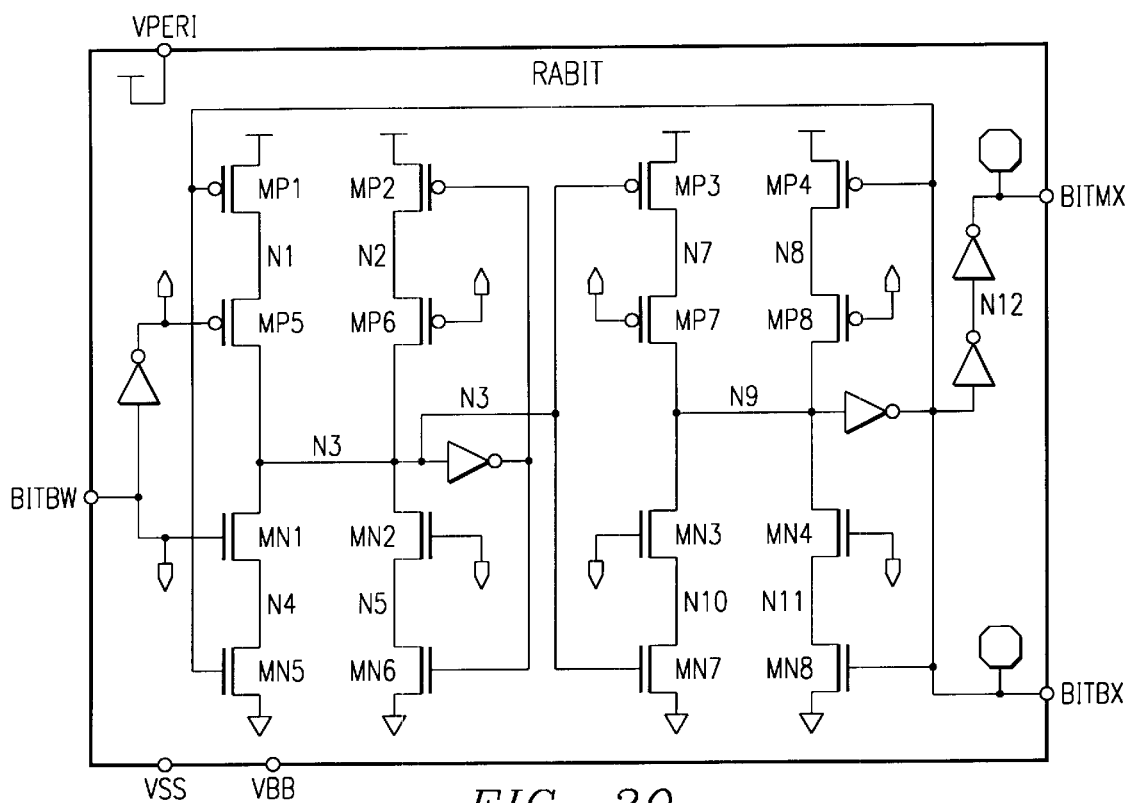
FIGS. 20 and 21 are row address bit counter circuits for the arrangement of FIG. 39.
Figure 21:
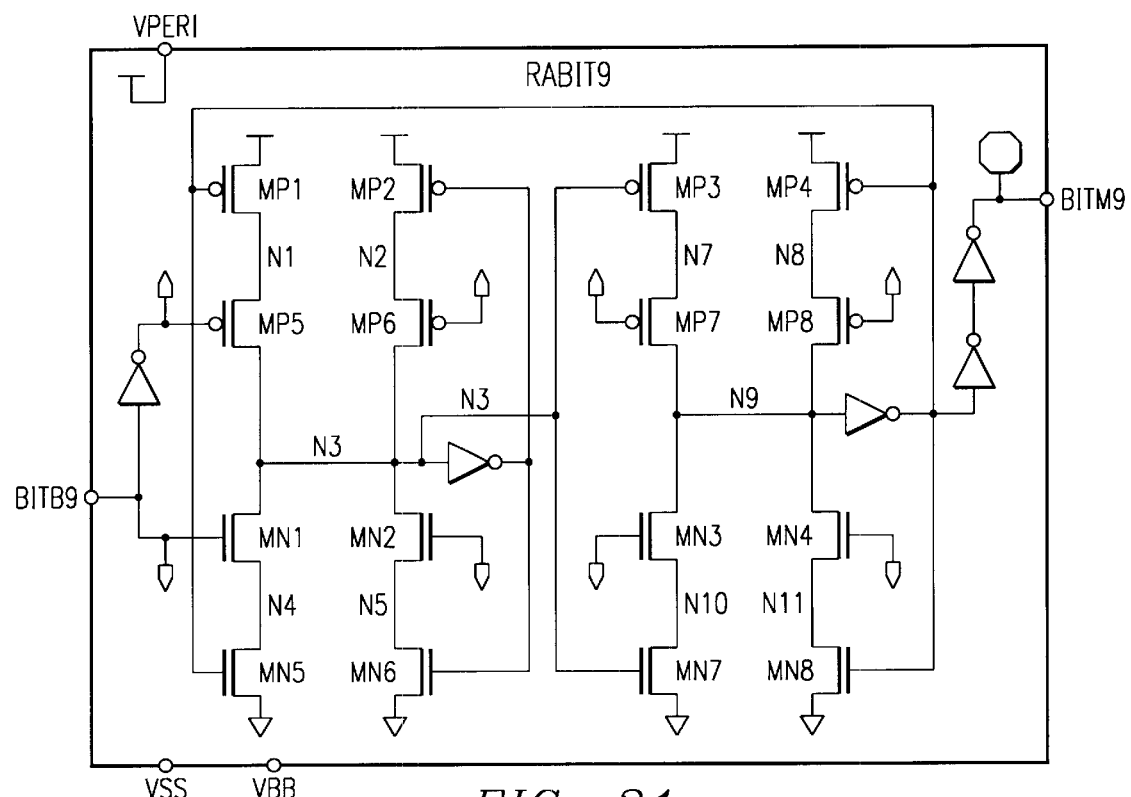
Figure 22:
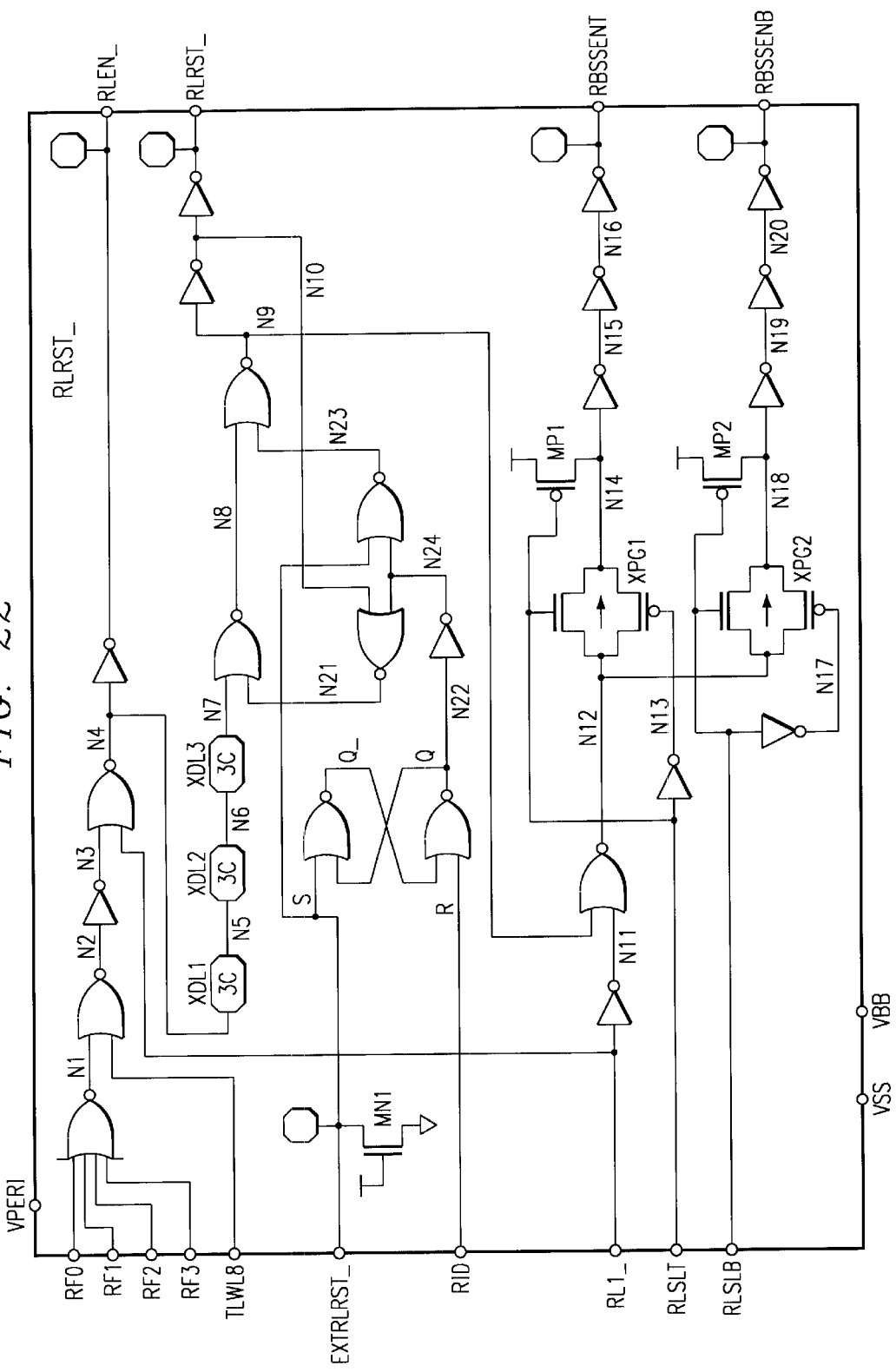
FIG. 22 is a row logic reset circuit for the arrangement of FIG. 39.
Figure 23:
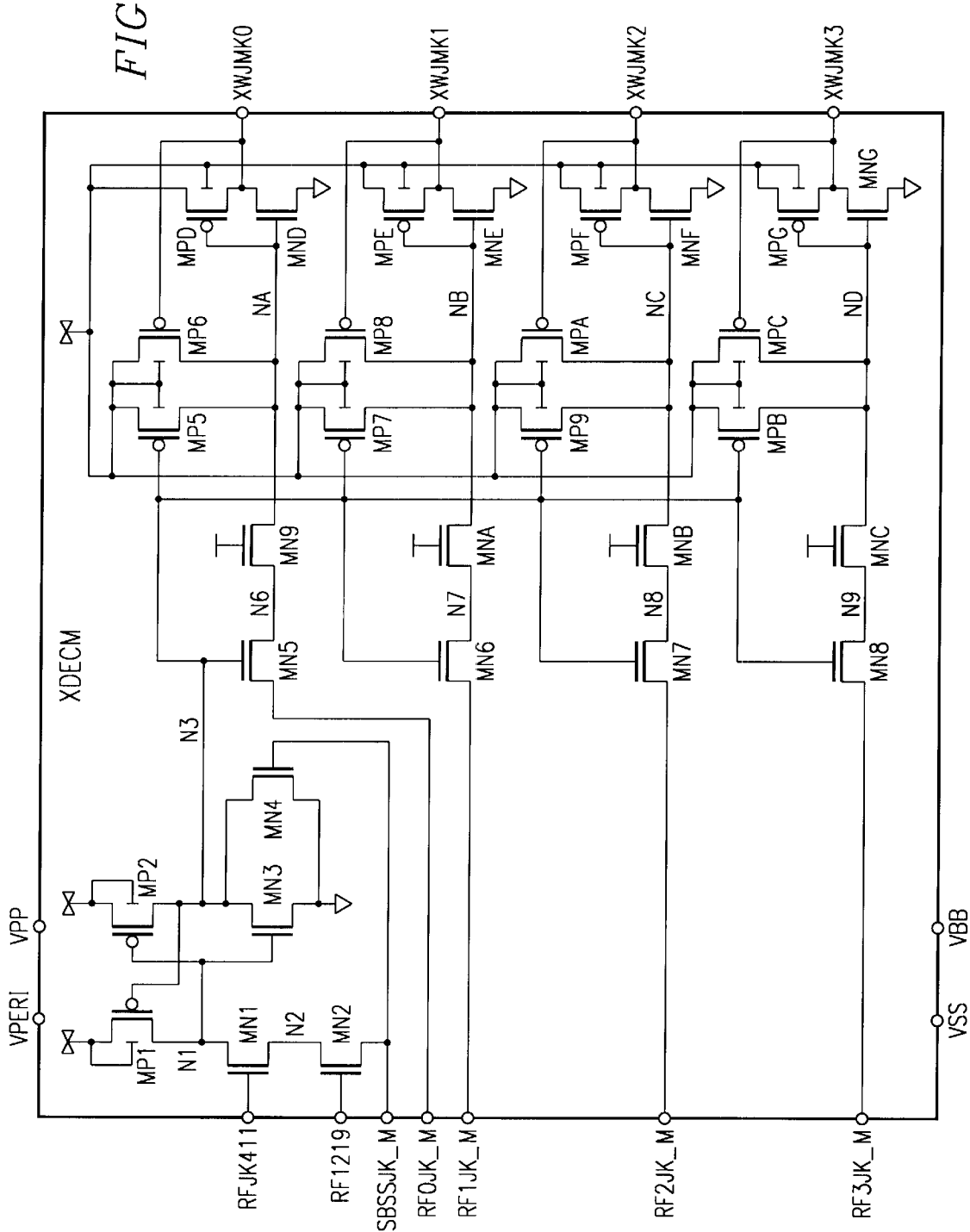
FIG. 23 is a row decoder circuit for the arrangement of FIG. 39.
Figure 24:
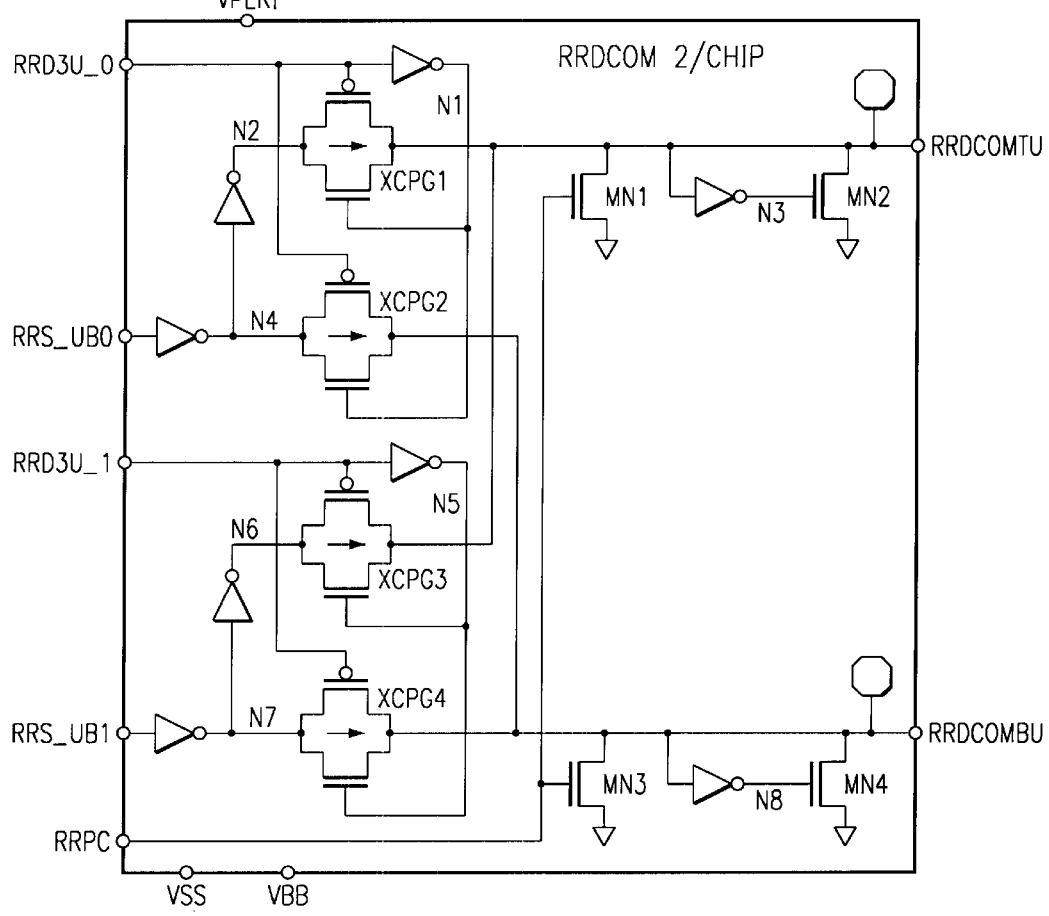
FIG. 24 is a redundant decoder for the arrangement of FIG. 39.
Figure 25:
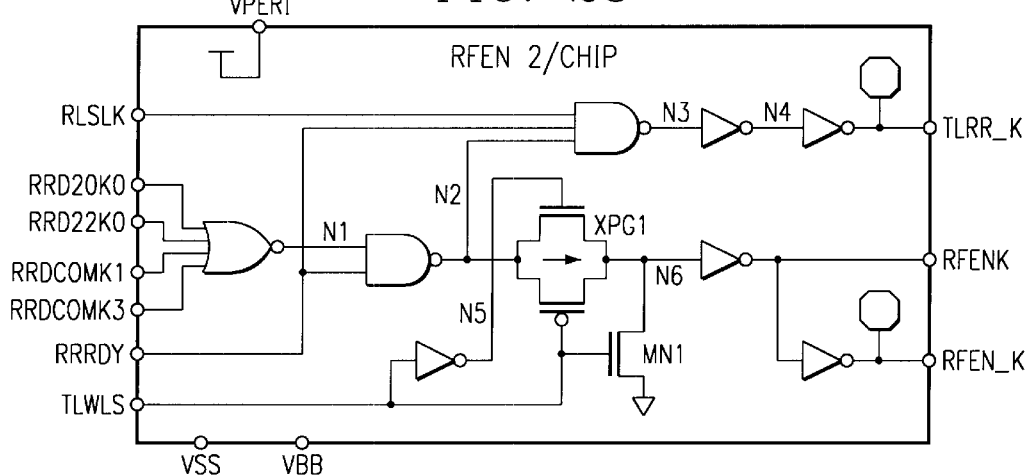
FIG. 25 is a row factor enable circuit for the arrangement of FIG. 39.
Figure 26:
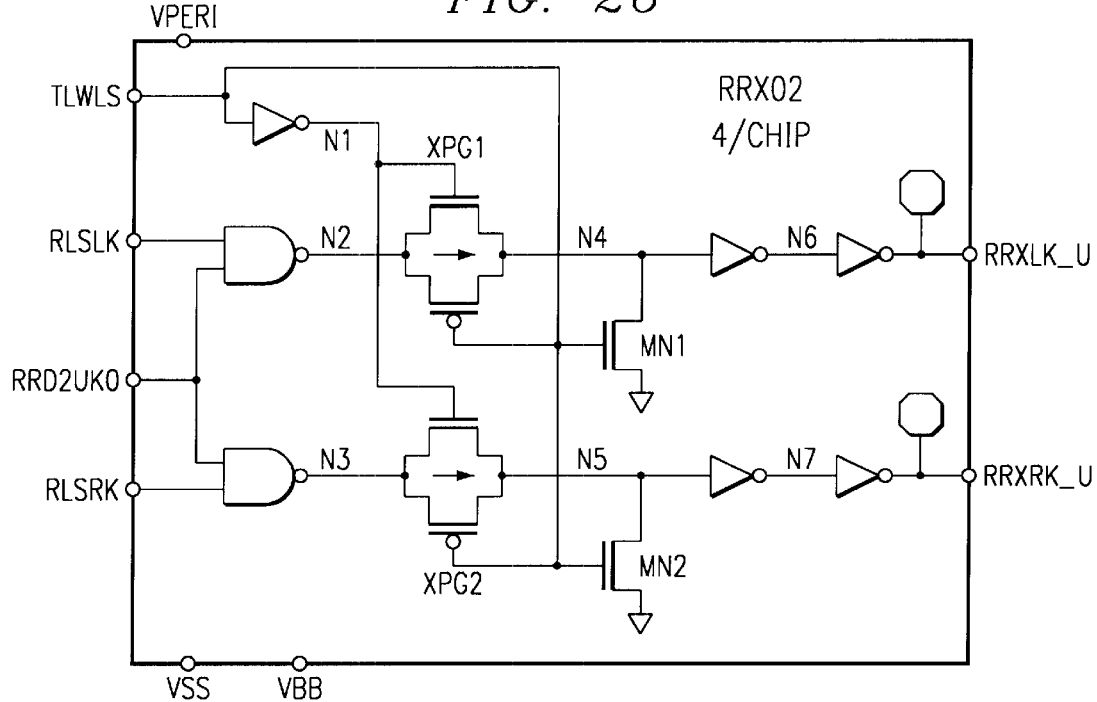
FIGS. 26 and 27 are row redundancy circuits for the arrangement of FIG. 39.
Figure 27:
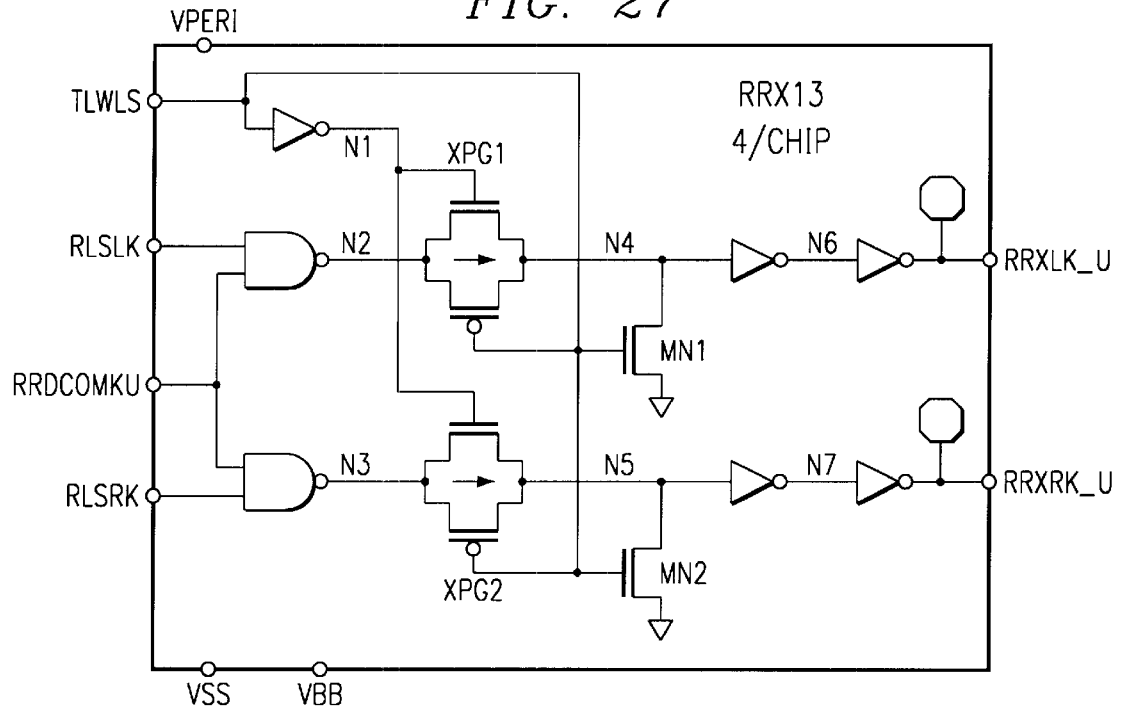
Figure 28:
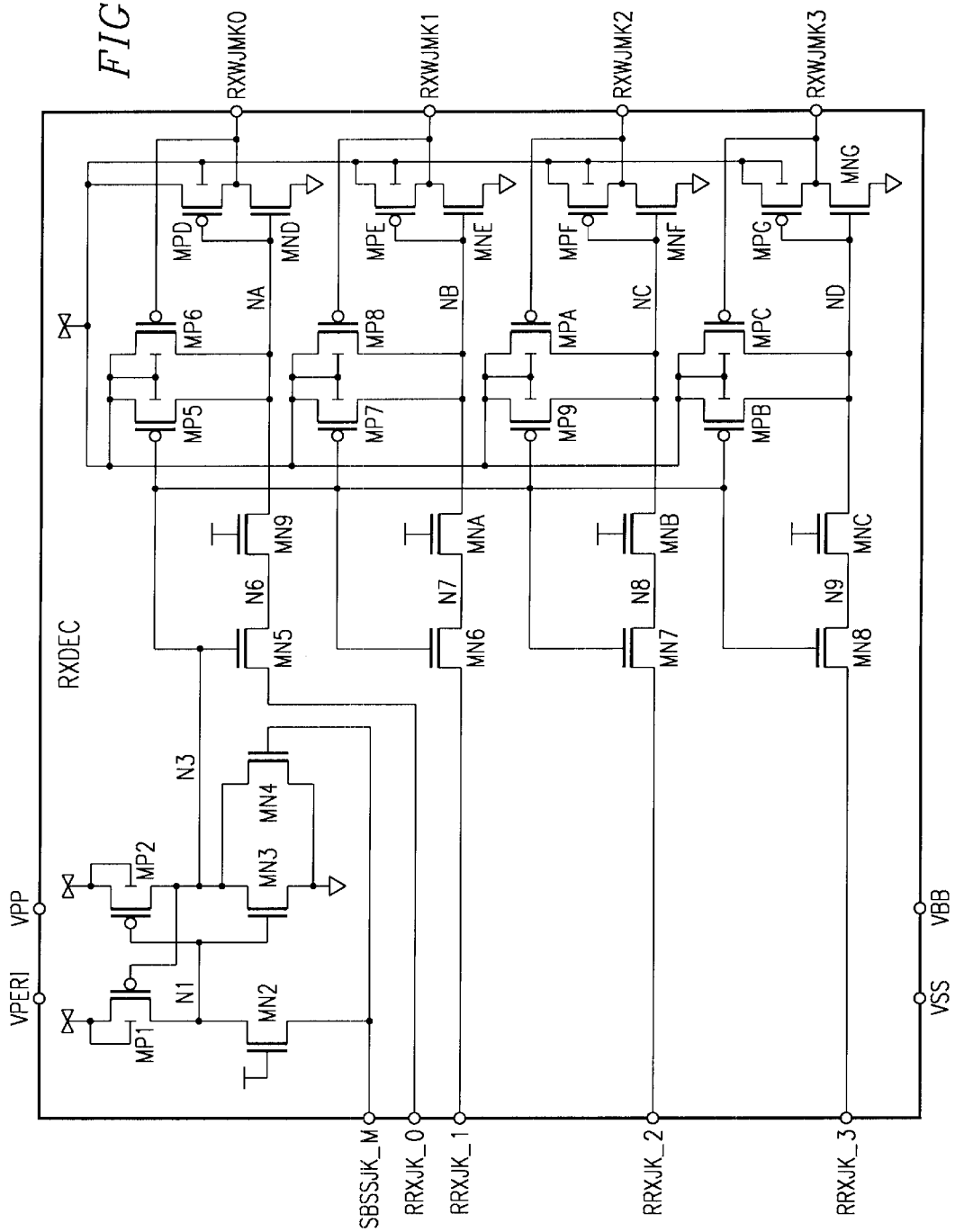
FIG. 28 is a row redundancy decoder for the arrangement of FIG. 39.
Figure 29:
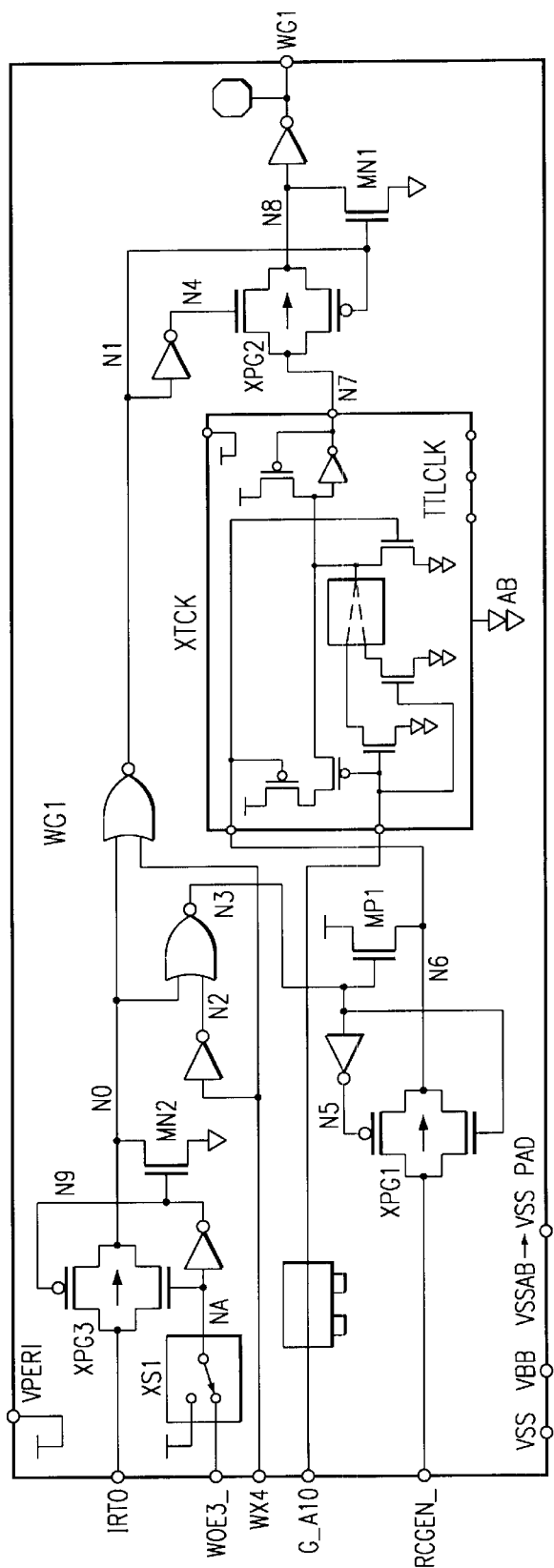
FIG. 29 is a control circuit for the arrangement of FIG. 31.
Figure 30:
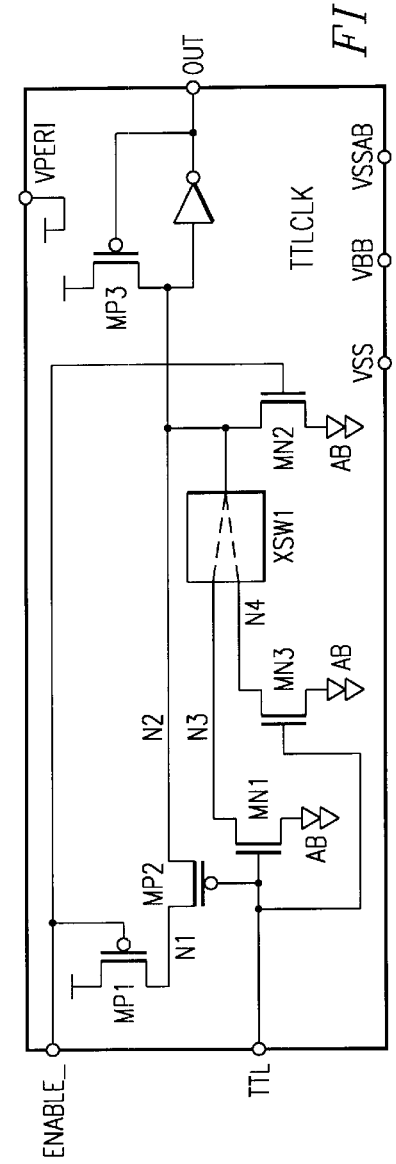
FIG. 30 is a transistor-transistor-logic (TTL) input buffer for the arrangement of FIG. 1.
Figure 31:
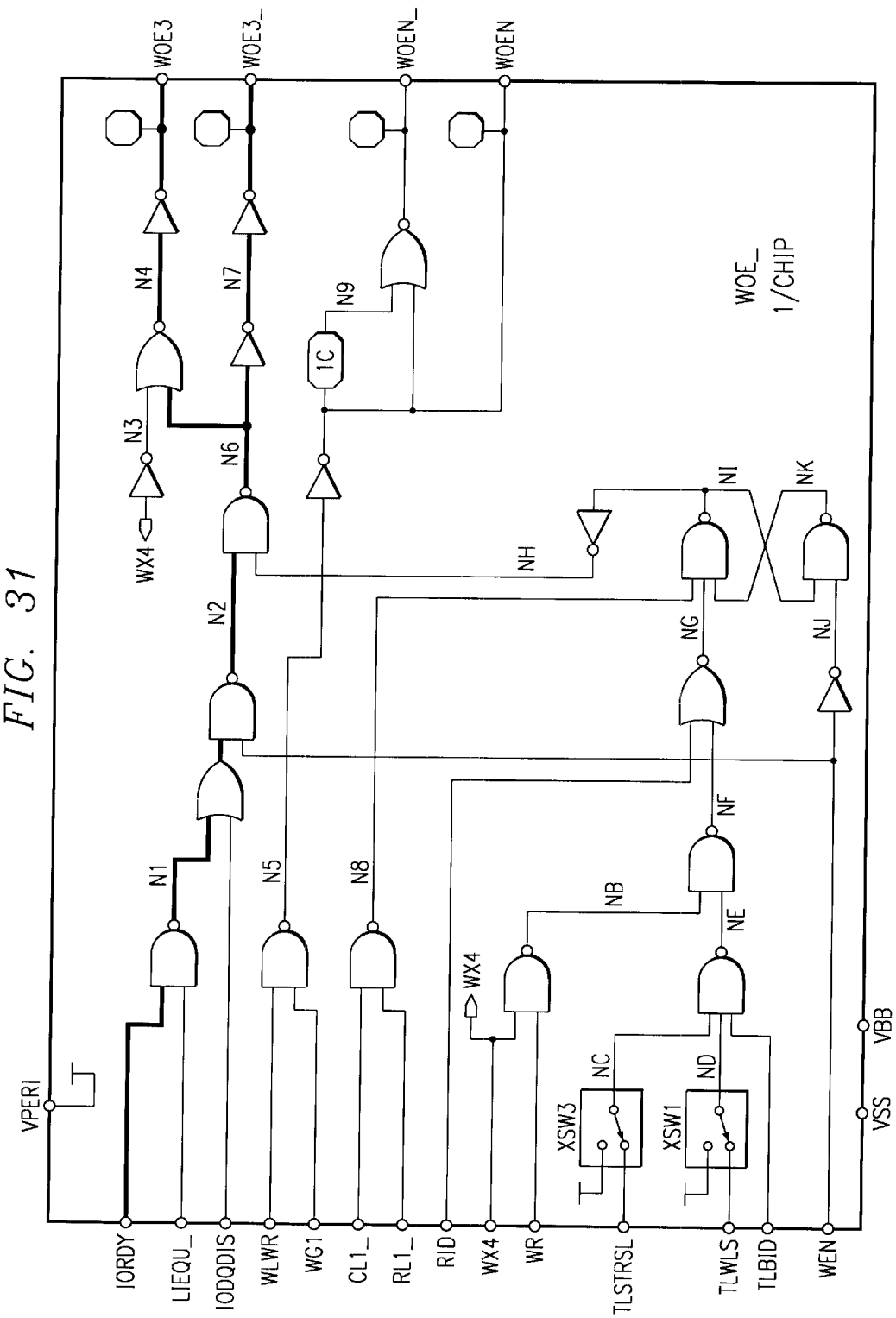
FIG. 31 is a Write Output Enable circuit for the arrangement of FIG. 39.
Figure 39:
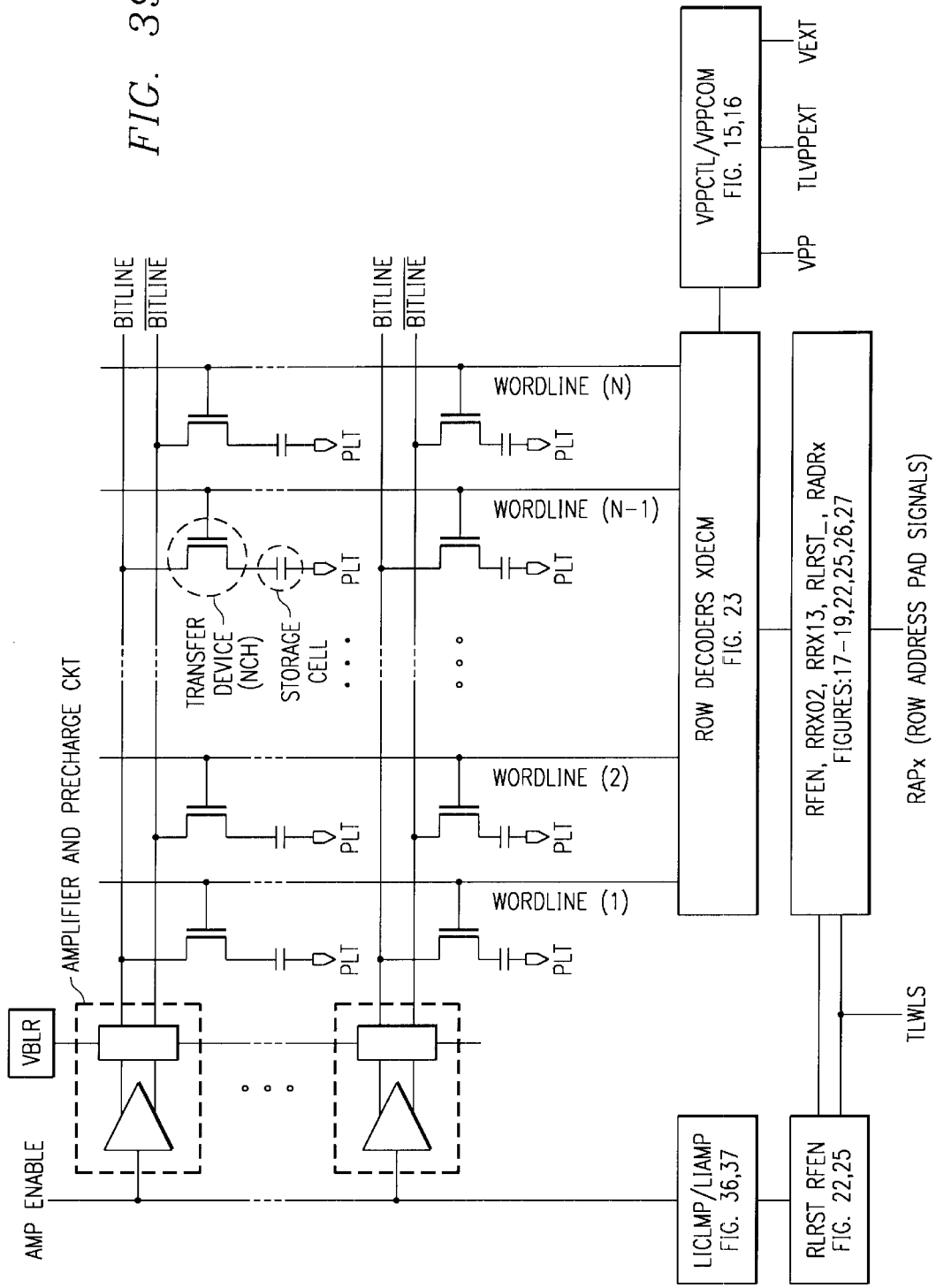
FIG. 39 is a memory array with decoders, amplifiers and row decoder logic.

Normally the wordline voltage is controlled by a booted device or else a positive supply voltage to offset Vt losses. Since the pump has limited current drive it is desired to clamp the VPP supply source to the Vext bond pad to allow precise external control. To accomplish this the normal VPP pump circuitry is inhibited with a control signal TLVPPEXT, as shown in FIGS. 15 and 39. This signal is supplied to the VPP Control of FIG. 15 to generate the signal VPPCLMP that drives the VPPCOM block, shown in FIG. 16, to clamp the internal supply voltage VPP to the pin Vext.

Figure 32:
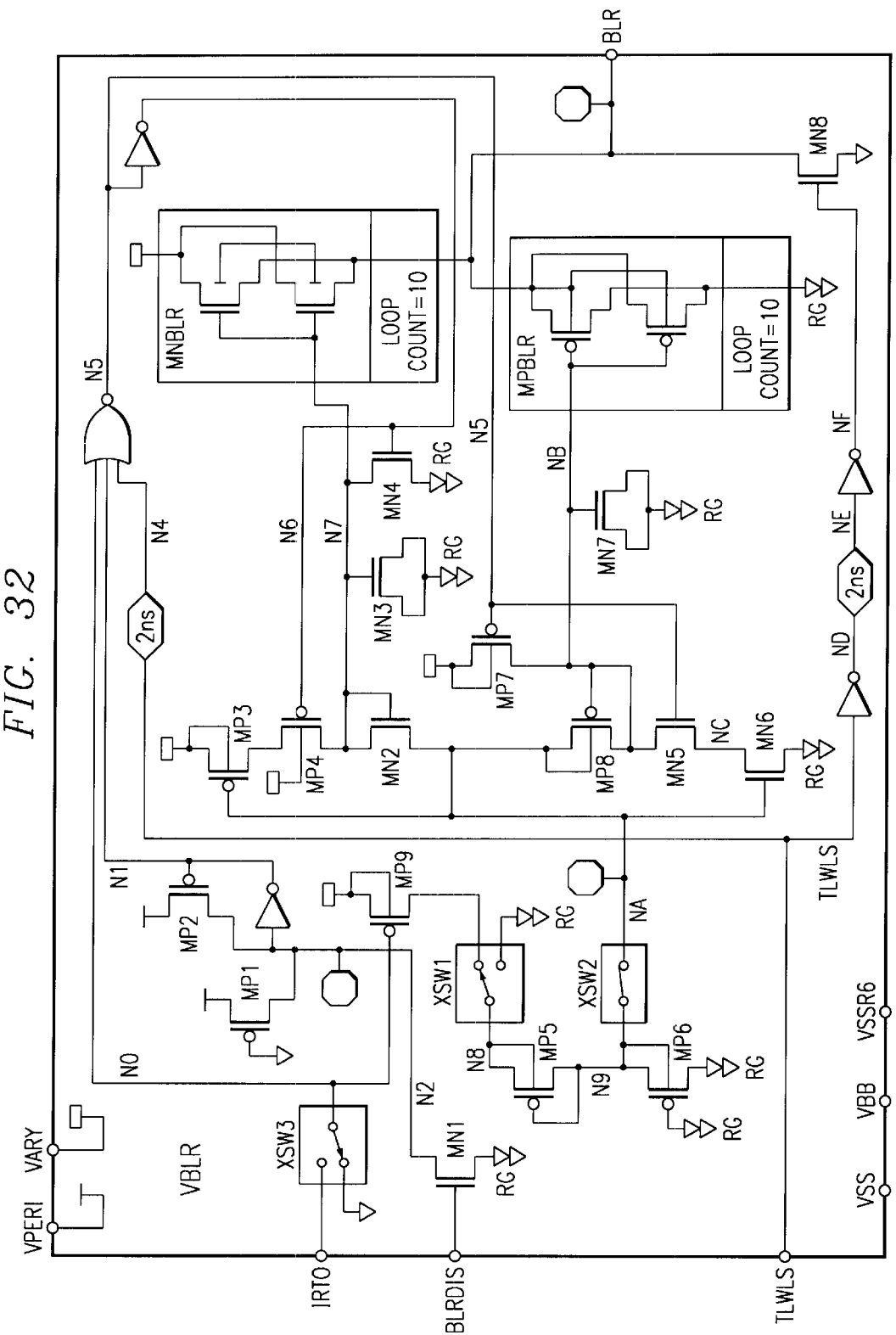
FIG. 32 is a bitline reference circuit arrangement of FIG. 39.
Figure 33A:
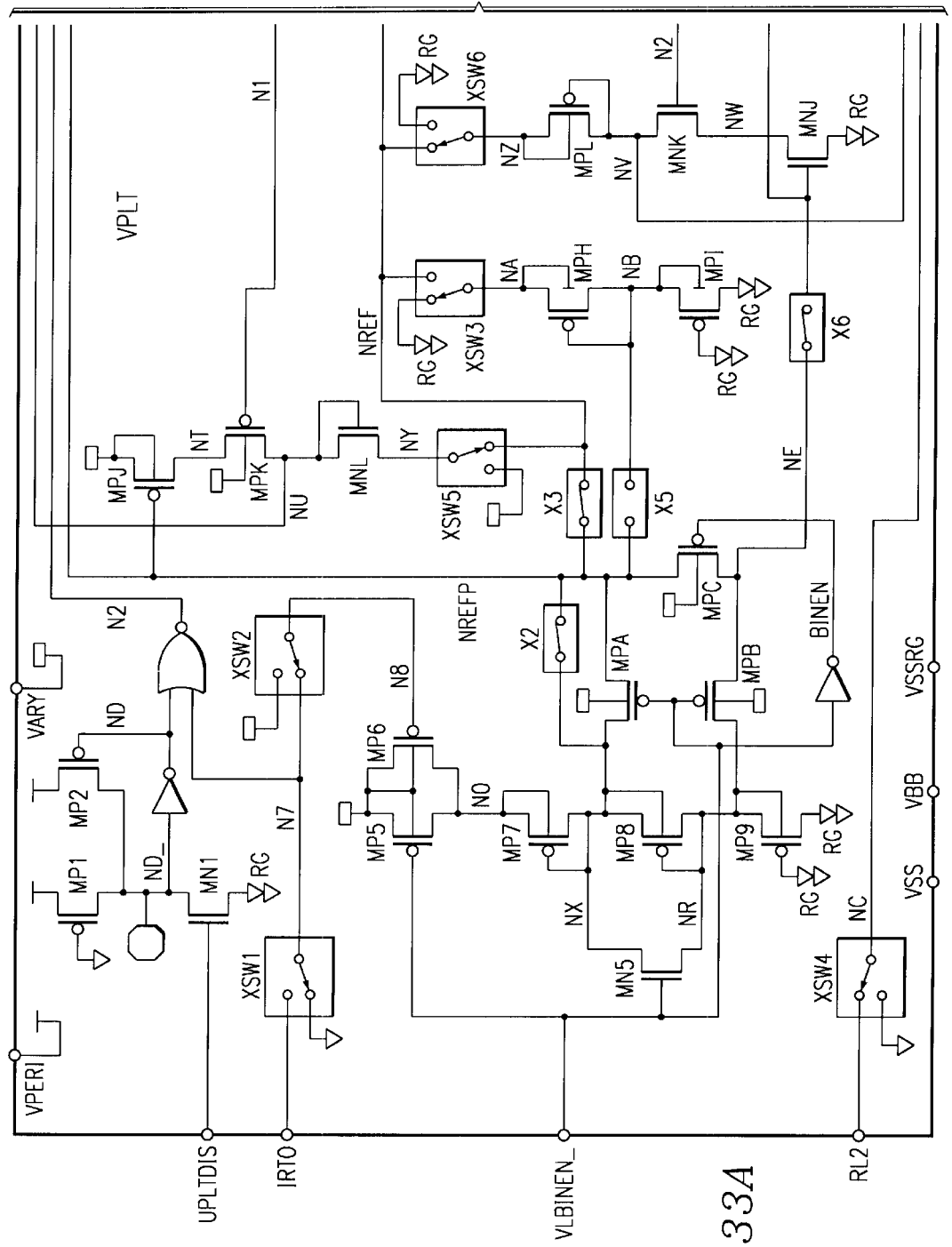
FIG. 33 is a top plate reference circuit for the arrangement of FIG. 39.
Figure 33B:
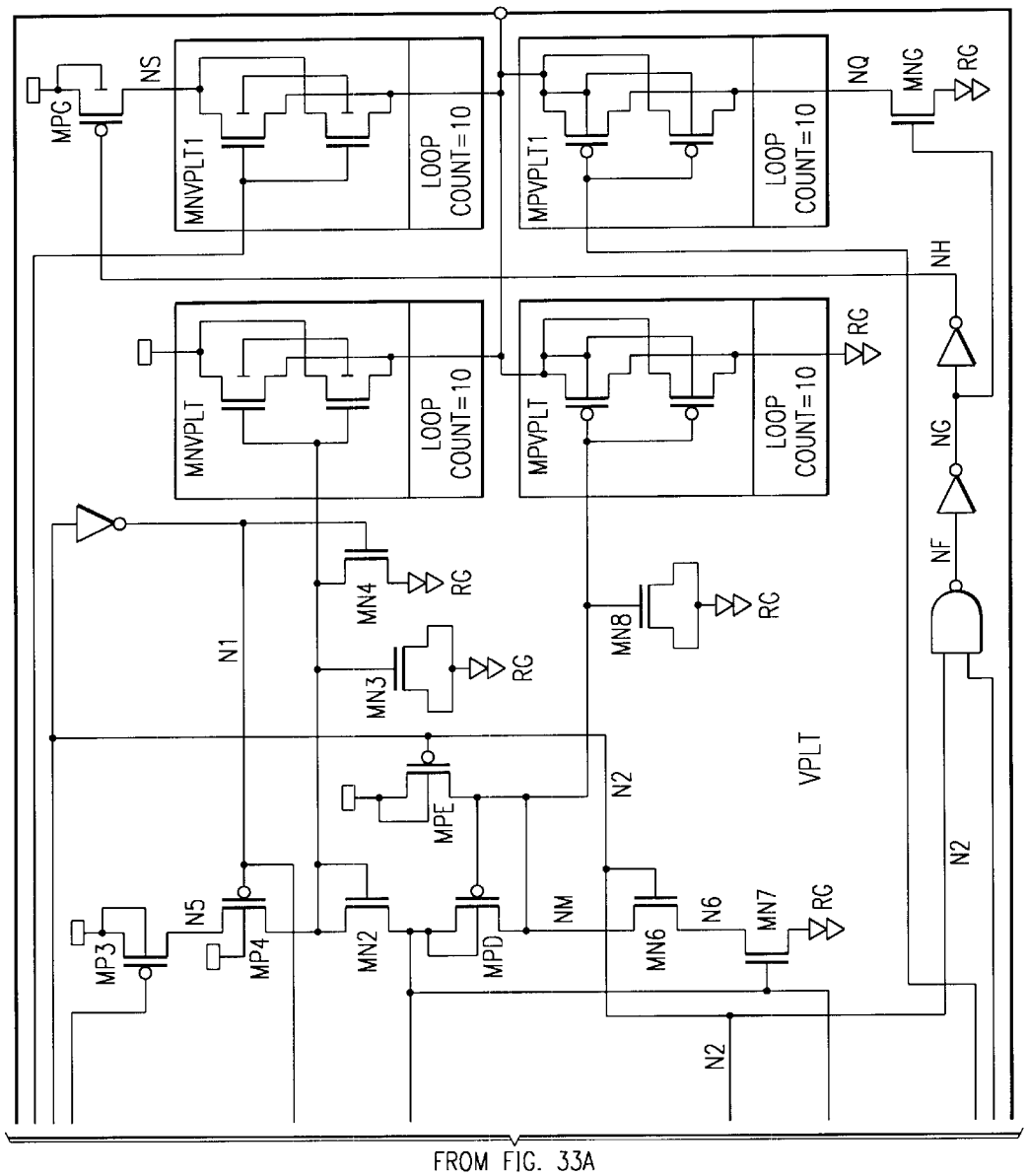
Figure 34:
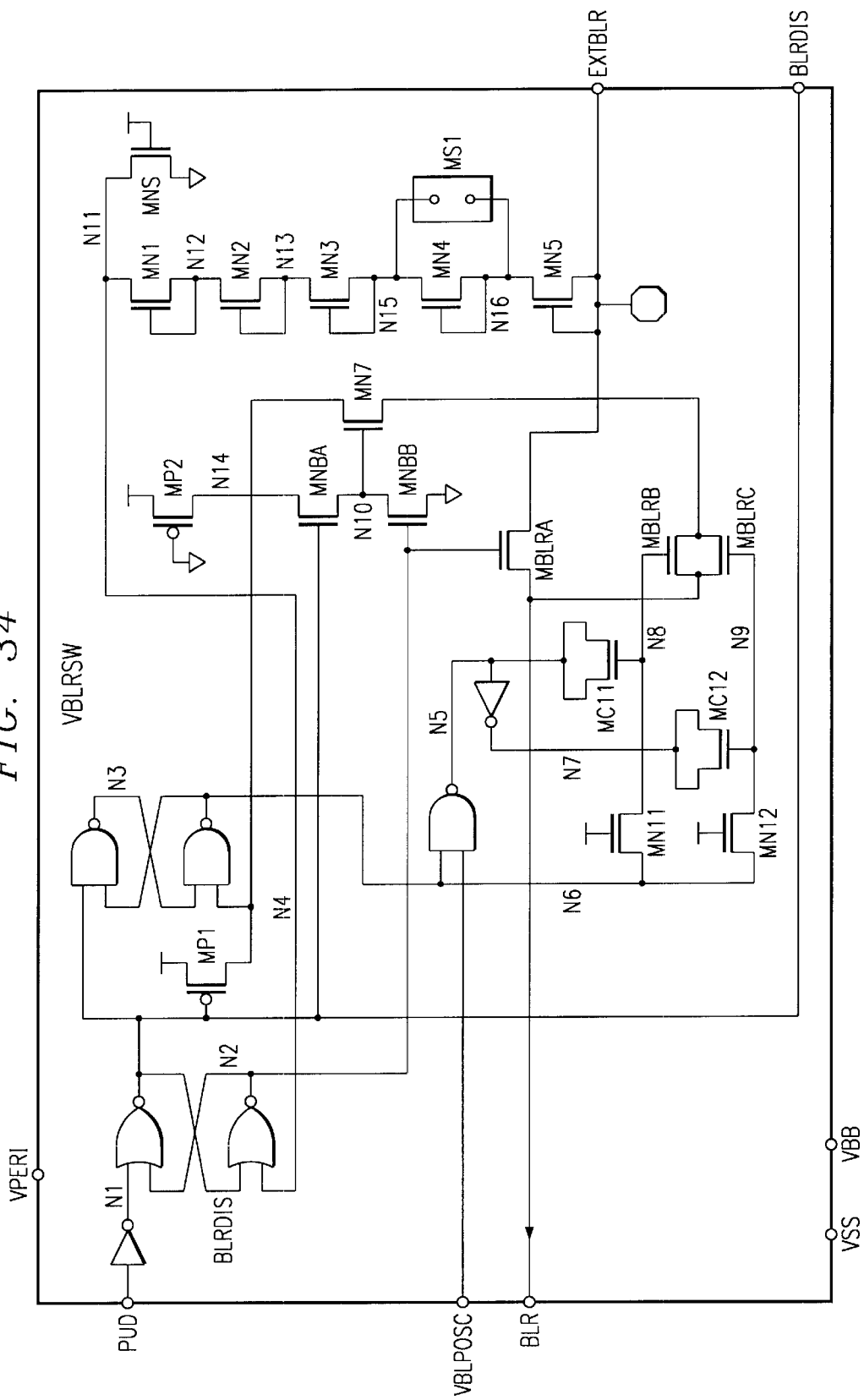
FIG. 34 is a bitline reference switch for the reference circuit of FIG. 32.
Figure 35:
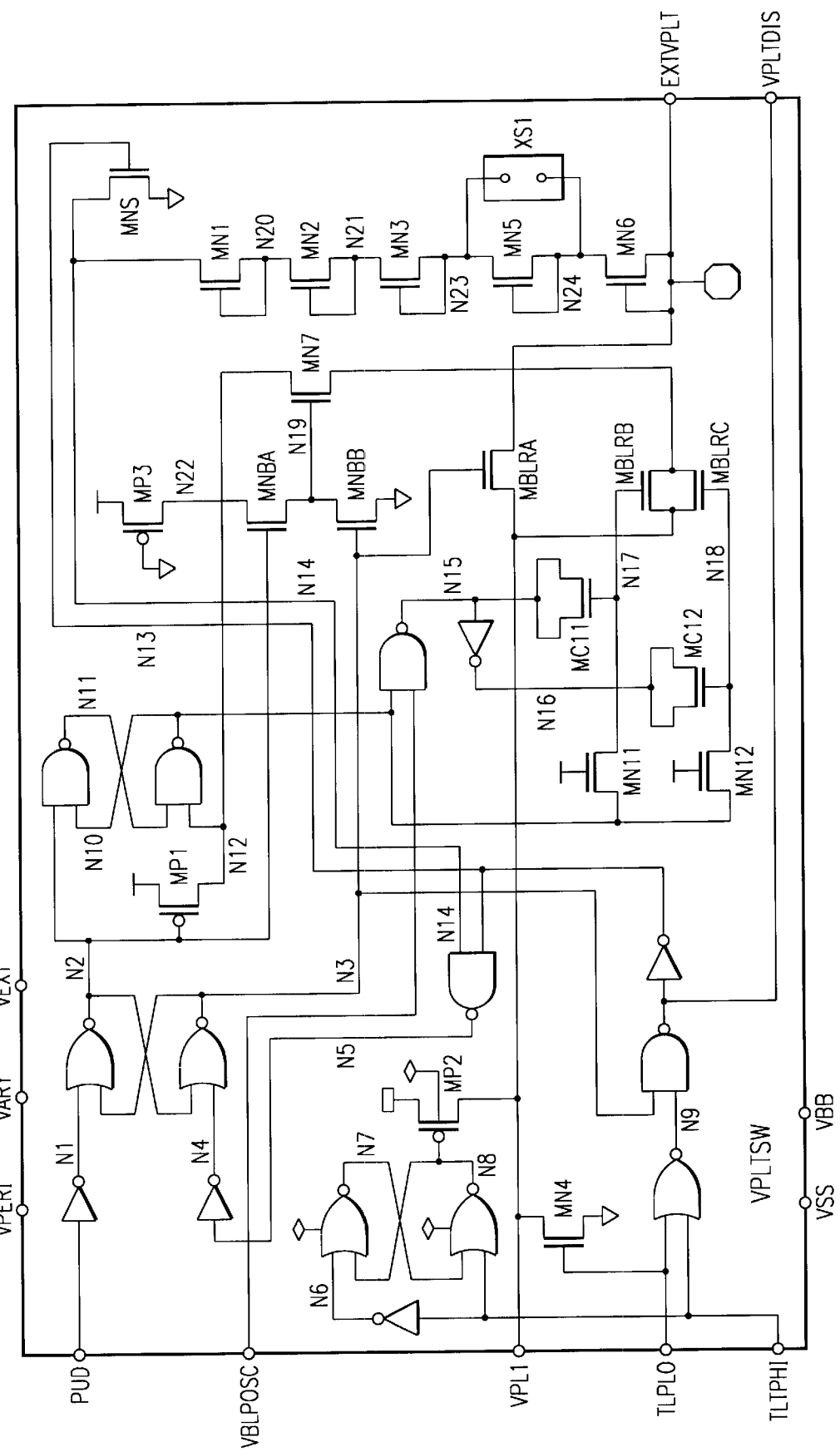
FIG. 35 is a top plate switch for the supply circuit of FIG. 33.

This design overcomes problems of prior devices by asserting all of the transistors in the array by activating all of the wordlines during one test cycle using a test mode to control the internal decoding of the device. To assert all the wordlines in a given cycle, the control signal TLWLS is routed to all the necessary predecoders and factor generators to enable all the wordlines simultaneously. The routing circuits are shown in FIGS. 17, 18, 22, 25, 26, 27. In addition to asserting all of the wordlines, the bitline reference voltage for the bitlnes is clamped to the supply voltage VSS, as shown in FIG. 32. The sensing operation is inhibited at that time.

The clamping of the bitline reference voltage VBLR provides two functions. For stress modes, it provides a low potential relative to the wordline voltage on all source drain regions of the transfer devices in the array of storage cells, as shown in FIG. 39. For non-stress modes, it provides the initialization value for all of the cells, shown in FIG. 39. The bitline reference voltage VBLR is generated in the VBLR block, shown in FIG. 32. The control signal TLWLS, generated in the circuit 110 of FIG. 1 inhibits the normal voltage divider and clamps the bitline reference voltage to ground VSS. A similar initialization scheme can be used to write a logic one to all the cells by clamping the bitline reference voltage VBLR to the supply voltage VDD. This is an easy extension of the foregoing but is not shown in the schematics. To avoid contention between the sensing amplifier and the bitline reference voltage VBLR, the normal sensing operation is defeated. The control signal TLWLS is applied to the RLRST_block of FIG. 22 to inhibit the generation of RLEN_Row Logic ENable_signal RLEN_ and hence the assertion of the sense amplifiers.

The described arrangement is designed to inhibit the sense amplifiers and to take control of the precharge circuitry to provide the proper reference voltage to the memory devices to be stressed. The net effect of the test is to initialize all of the bitlines. Hence the memory cells are initialized to a predetermined state and all of the wordlines are asserted to write the values into the storage cells of the array. The above condition clamps the internal wordline supply voltage to the external voltage Vext allowing a precise wordline voltage to be supplied when stressing of the cell is desired.

Figure 36:
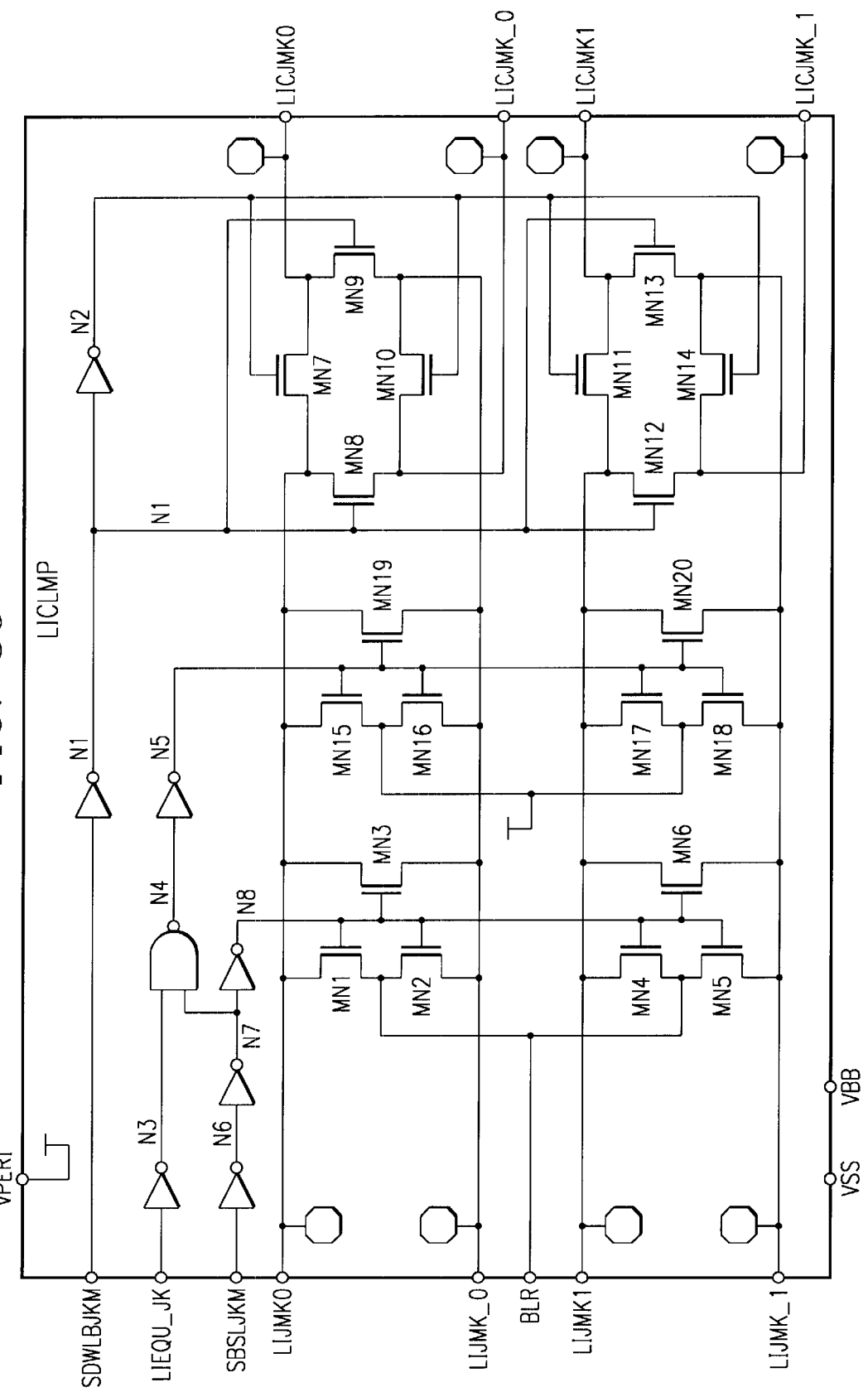
FIG. 36 is a local I/O clamp circuit for the arrangement of FIG. 39.
Figure 37:
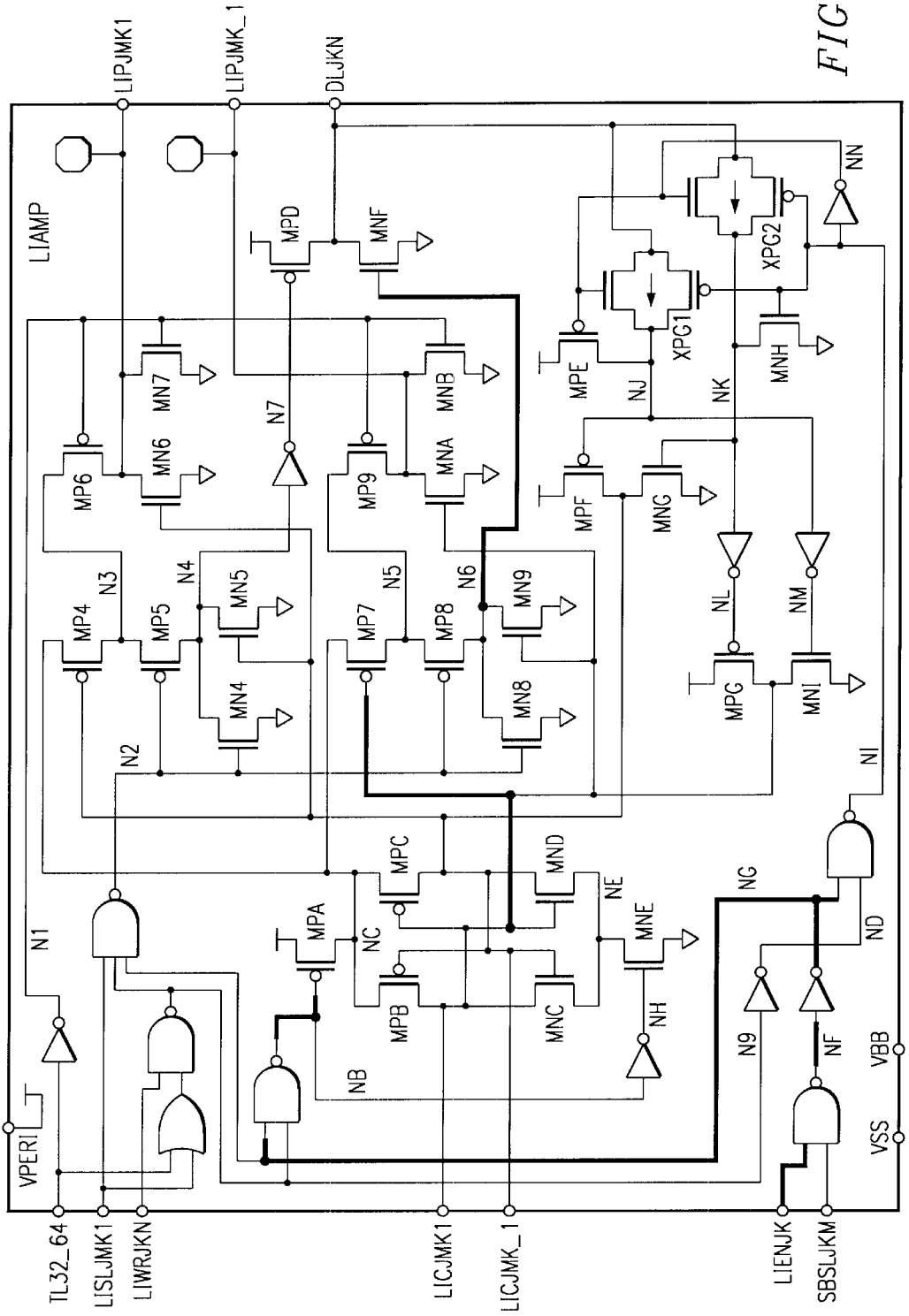
FIG. 37 is a local amplifier circuit for the arrangement of FIG. 39.

If normal supply voltages are applied, the test mode functions as an initialization scheme to clear all of the storage cells. For the cell initialization procedure to read the correct data, the concept of true data polarity is used to correct for data inversion between the true and complement bitlines when connected to a cell of the same data state. Upon a read operation, the addresses are decoded such that true and complement bitline information is retained. A steering logic scheme is used to invert the complement bitline data before connection to the local IO lines, thus correcting for any data inversion. This scheme is also advantageous for debugging with a bitscope as the true data on the data pins DQ is always written to the cell. The steering logic is controlled by the dummy wordline decoding to determine if true or complement addressing is active. This signal SDWLBJKM drives the schematic block LICLMP FIG. 36. Within the LICLMP block of FIG. 36, the control signal will either enable the N–channel transistors MN7, MN10 or the N–channel transistors MN8, MN9 to steer the differential data pair of local IO lines LIC.

To conduct the stress mode portion of the test, the engineer will typically assert some amount of function test prior to stress mode entry. Next the engineer will assert the desired test mode with a write low, CAS before RAS WCBR entry cycle. For wordline stress the device will be cycled to enter the test mode and row access strobe RAS_will be held low for the prescribed test time. During this time the test engineer applies the desired stress potential to the Vext pad Vext and hence the internal wordlines. A CAS before RAS CBR, RAS only refresh timing set ROR or test mode exit sequence is used to finish the test and again additional functional testing can be carried out to determine the accelerated failures induced by this test mode. Acceleration factors can be further adjusted by changing the temperature of the device.

The above procedure will initialize the cells to logic zero thus providing a simple means to clear all the cells in one test cycle. In this mode the voltage Vext is not elevated to a stress level.

The foregoing test arrangement provides the advantage of precise control of test time and test voltages. Overstress and understress of the device under test can be avoided. All transistors of a given type on the device undergo the same stress conditions. Test time can be substantially reduced. Burn–in can be eliminated.

| TEST MODE | KEY | C[1] | DESCRIPTION |
|---|---|---|---|
| JEDEC PARALLEL R/W X8 | none[2] | | JEDEC X8 test mode. No expected data. |
| NULL | 00h | | Exit non-concurrent modes. |

-continued

| TEST MODE | KEY | C[1] | DESCRIPTION |
|---|---|---|---|
| CLEAR | 01h | | Clears DFT modes without clearing the internal overvoltage latch. |
| CHIP STRESS | 02h | C | Vary = Vperi = Vpp clamped to Vext. |
| WORDLINE STRESS | 03h | C | All wordlines = Vext. BLR and B/L's clamped to Vss. Static test. |
| BURN-IN STRESS | 04h | | Chip stress and wordline stress entry with single cycle. |
| TOP PLATE HIGH | 05h | C | Clamp Vplate to Vary. |
| TOP PLATE LOW | 06h | C | Clamp Vplate to Vss. |
| ANALOG MONITOR | 07h | | Monitor analog supplies (Vperi, Vary, Vblr) at selected pins. |
| PARALLEL R/W EDx16 | 40h | | 1 bit/block. Four quadrant activation (16 blocks). |
| PARALLEL R/W EDx32 | 41h | | 4 bits/block. Two quadrant array activation (standard 8 blocks) |
| PARALLEL R/W EDx64 | 42h | | 4 bits/block. Four quadrant activation (16 blocks). |
| INTERNAL REFRESH TEST | 43h[3] | | Internal refresh CBR counter test. |
| CHIP IDENTIFIER TEST | 44h | | Read ROM fuse data. |
| ROW REDUNDANCY ROLL | 45h | | Check if accessed row is redundant. |
| COLUMN REDUNDANCY ROLL | 46h | | Check if accessed column is redundant. |
| BURN-IN DETECTION | 47h | | Check status of the stress mode and/or word - line stress (metal option selectable). | notes:
[1]Concurrent test mode
[2]JEDEC entry with WCBR no overvoltage
[3]A3 overvoltage must be maintained.

| Compression | bits/ block* | Active Blocks | Address not used |
|---|---|---|---|
| COMPRESSION | | | |
| x16 | 1 | 16 (2x standard) | RA9 RA10 CA10 CA0 |
| x32 | 4 | 8 (standard) | RA10 CA10 CA0 CA1 CA2 |
| x64 | 4 | 16 (2x standard) | RA9 RA10 CA10 CA0 CA1 CA2 |

*block constitutes an active 256k array (4-bits denotes a local comparison at the block level)

EXPECTED DATA (ED)　　Data latched on RAS (first cycle) and CAS (succeeding cycles for page mode accesses). X4 will use data from respective DQn.

OUTPUT

| | | |
|---|---|---|
| X1 | All data equal to ED | Q = ED |
| | All data not equal to ED | Q = $\overline{ED}$ |
| X4 | DQn compressed data equal | DQn = ED |
| | DQn compressed data not equal | DQn = $\overline{ED}$ |

TEST MODES REMOVED (Relative to Current 4M)

| TEST MODE | KEY | REASON FOR REMOVAL |
|---|---|---|
| ROW COPY | 04h | Too complex with bitline twist. Not used. |
| REDUNDANCY SIGNATURE | 43h | Not used. |

TEST MODE DETAILED DESCRIPTIONS

ADDRESS KEY DECODING

| 6542310 | hex | SIGNAL NAME | FUNCTION |
|---|---|---|---|
| XXXXXX | — | \multicolumn{2}{l}{TL8 (JEDEC X8 Parallel test withOUT expected data)} |

| 6542310 | hex | SIGNAL NAME / FUNCTION |
|---|---|---|
| XXXXXX | — | TL8 (JEDEC X8 Parallel test withOUT expected data)<br>The JEDEC 8-bit parallel test mode is a standard customer test mode that compares only internal data to see if the 8-bits are equal. This mode is entered with a WCBR cycle. Read/write cycles address one bit from each of the 8 active blocks. In the case of the X1, the 8-bits will be compared to see if they are equal. If equal, the output will be driven high, Otherwise, Q will be driven low. A X4 compares 2-bits for each DQ for a total of 8 bits. DQn will be driven high if the 2-bits are equal, low if not equal. This mode is exited with a CBR or RAS-only-refresh (ROR) cycle. |
| 0*000 | 00 | TLNULL (Test Logic NULL)**<br>Null-Null Test, used to exit the non-concurrent test modes only. The internal over-voltage latch is not reset, thus if no non-concurrent test modes are active the chip is placed into a suspended type test mode. A new DFT mode can be selected at this point with a WCBR cycle and address key (no over-voltage needed). This mode does not effect concurrent test modes. |
| 0*001 | 01 | TLCLR (Test Logic CLeaR)**<br>Clear-Clears all DFT modes (concurrent and non-concurrent) without clearing the internal over-voltage latch. This mode allows any normal cycle(s) to be executed while offering the ability to re-enter internal DFT test modes without the execution of an A3 over-voltage cycle. An address key and WCBR cycle are the only necessary conditions to re-enter an internal test. A CBR refresh or ROR cycle will cause the internal latch to be reset and require the over-voltage on A3 to be asserted for the next DFT entry. |
| 0*010 | 02 | TLSTRS (Test Logic STReSS)**<br>Chip Stress (concurrent)-The voltage regulated device will clamp the internal supplies (Vary, Vperi, Vpp) to Vext. |
| 0*011 | 03 | TLWS (Test Logic Wordline Stress)**<br>Wordline Stress (concurrent)-The wordline stress mode forces a Vext level on all wordlines simultaneously. The Vext level is obtained internally by clamping Vpp to Vext. At the same time, BLR will be forced to ground. This will increase burn-in efficiency with the 100% duty cycle stress of Vext across the cells' transfer gates. |
| 0*011 | 04 | TLBI (Test Logic Burn-In)**<br>Burn-in: This mode combines the functions of the wordline stress mode and the chip stress mode with a single keyed entry. Upon entering this mode, Vary, Vperi and Vpp will be brought to Vext. In addition, BLR will be grounded and the wordlines will all be activated simultaneously. |
| 0*101 | 05 | TLTPH (Test Logic Top Plate High clamp)**<br>Top Plate High clamp (concurrent)-This mode will clamp the Vplate level to Vary. When combined with TLSTRS (chip stress mode) the plate voltage can be controlled with Vext. This mode is useful for stressing the storage gate oxide when the storage node is held at Vss (may be used in combination with TLWS or TLBI to achieve this with 100% duty cycle). |
| 0*110 | 06 | TLTPL (Test Logic Top Plate Low)**<br>Top Plate Low clamp (concurrent)-This mode will clamp the top plate to Vss. This enable a greater gate oxide stressing, especially when the storage node is at a logic one level. This stress can be further accelerated when used in combination with TLSTRS. |
| 0***100 | 07 | TLMON (Test Logic MONitor)<br>Monitor-The monitor mode will allow the internal analog supplies to be monitored externally through several address pins. When enabled, BLR can be monitored on A5, Vary on A7, and Vperi on A8. In the case of monitoring BLR, the A5 buffer will be internally disabled to prevent DC current from flowing due to the input's intermediate state. **NOTE: A5, A7, and A8 are output drivers in this mode and should not be driven by the test system. |
| 1*000 | 40 | TL16 (X16 Parallel test with expected data, 16 block -2x- activation)**<br>The chip will be fully activated in this mode, thus utilizing all 4 physical quadrants (16 active blocks). One bit from each 256k active block will be compared with the corresponding expected data. Compare status will be output on separate DQ's in the X4 architecture. For X1 devices, a further 4 to 1 compare will be made, again with expected data, and the results provided on the Q output. If the device passes, then the output will be that of the expected data value. Conversely, a failing device will output the complement of expected data. This mode offers the advantages of one bit per block comparisons (no bit adjacency influence) at the expense of the added power in activating twice the number of blocks (16). |
| 1*001 | 41 | TL32 (X32 Parallel test with expected data, normal activation)**<br>The X32 test mode will use the standard 8 block activation using the top or bottom two quadrants. The 8 activated blocks will locally compare 4 bits to the expected data, resulting in 32 bits tested in parallel. In the case of the X4 the output will reflect data comparison's done within the corresponding DQ. If the device passes, then the output will be that of the expected data value. Conversely, a failing device will output the complement of expected data. |
| 1*010 | 42 | TL64 (X64 Parallel test with expected data. 16 block -2x- activation)**<br>This test mode is a hybrid between TL16 (double array activation-16 blocks) and TL32 (4 bit local compare). The net result is 16 active arrays comparing 4 bits each for a total of 64 bits tested in parallel. If the device passes, then the output will be that of the expected data value. Conversely, a failing device will output the complement of expected data. |
| 1*011 | 43 | TLIR (Test Logic Internal Refresh)**<br>Internal refresh test-This mode is entered and maintained throughout the test with an A3 over-voltage. Unlike the other test modes, A3 must continuously be held at OV to remain in this test mode because the normal CBR cycle during IR would otherwise exit this test. Following the WCBR/A3-OV entry, $\overline{W}$ must continue to be held low. Along with $\overline{W}$, data and the column address must be maintained throughout the $\overline{RAS}$ low period. This RAS low period will be determined by the refresh time used in the extended refresh tests. By proving the internal refresh frequency is |

| | | -continued | |
|---|---|---|---|
| | | ADDRESS KEY DECODING | |
| 6542310 | hex | SIGNAL NAME | FUNCTION |
| | | greater or equal to the refresh test rate previously tested, we are able to guarantee the functionality of the device using IR at that particular refresh interval. When in IR test mode, the device will cycle through the row as it would in the standard IR entry. Additionally, the device will write to the given column much like the CBR counter test. Because these internal counter tests occur asynchronously with the external world, $\overline{W}$, column addresses and Din (DQn-in) must be maintained throughout the $\overline{RAS}$ low period. After exiting this mode by bringing $\overline{RAS}$ high, the column may be read to see if all bits along the column were written to correctly. | |
| 1***100 | 44 | TLCID (Test Logic Chip Identifier) Chip Identifier-Internal fuses (switches) are blown(set) to provide a unique device identification key. (This definition will expand as the design progress.) | |
| 1***100 | 45 | TLRRRC (Test Logic Raw Redundancy Roll Call) Row redundancy roll call-Status of Row repairs are provided at the output pins. Each row is accessed and the Q/Dq will be driven low if the addressed row has been repaired. | |
| 1***101 | 46 | TLCRRC (Test Logic Column Redundancy Roll Call) Column redundancy roll call-Status of the Column repairs are provided at the output pins. Each column is accessed and the Q/DQ will be driven low if the addressed columns has been repaired. | |
| 1***111 | 47 | TLBID (Test Logic Burn-In Detect) This mode is used to check the status of the stress mode(s) used for device burn-in. The integrity of the test is checked before burn-in and after burn-in to assure that the device was continually stressed for the entire duration of burn-in. Due to the hardware nature of burn-in testing (wired "OR" DUTs) a tri-state output is provided for devices that pass the test, and an active high output is used to indicate a fall. One device will fall the entire bank of devices on the bus. Active high output is used to provide a true TTL go/no-go compare for pass and fail since the single unit testers offer output pull-down resistors. This mode can be programmed with a metal option to check wordline stress and/or chip stress if desired. | |

The foregoing describes an illustrative embodiment of applicant's invention. That embodiment together with others, made obvious in view thereof, are considered to fall within the scope of the appended claims.

What is claimed is:

1. A circuit comprising:

an array of storage cells arranged in rows and columns;

a plurality of wordlines, each wordline connected with gates of transfer transistors of a different row of the storage cells;

a node for receiving a supply voltage;

a decoder, responsive to a control signal, for simultaneously applying the supply voltage to all of the wordlines of the array.

2. A circuit, in accordance with claim 1, wherein:

the supply voltage is applied from an external source.

3. A circuit, in accordance with claim 2, wherein:

the supply voltage has a selectable magnitude.

4. A circuit, in accordance with claim 1, wherein:

a supply voltage is applied for a predetermined time and has a predetermined magnitude.

5. A circuit, in accordance with claim 1, further comprising:

a plurality of complementary pairs of bitlines, each pair of bitlines interconnecting with the storage cells in a different column of the array;

a precharge circuit for precharging the plurality of complementary pairs of the bitlines to a precharge voltage; and a precharge disabling circuit, responsive to the control signal, for disabling the precharge circuit from applying the precharge voltage and for supplying an alternative voltage to both bitlines of each pair of the plurality of complementary pairs of bitlines.

6. A circuit, in accordance with claim 5, further comprising:

a plurality of amplifiers, each amplifier connected with a separate pair of the bitlines; and a circuit, responsive to the control signal, for disabling operation of the entire plurality of the amplifiers.

7. A circuit, in accordance with claim 6, wherein:

the supply voltage is applied from an external source.

8. A circuit, in accordance with claim 7, wherein:

the supply voltage has a selectable magnitude.

9. A circuit, in accordance with claim 6, wherein:

a supply voltage is applied for a predetermined time and has a predetermined magnitude.

10. A circuit, in accordance with claim 1, further comprising:

a plurality of complementary pairs of bitlines, each pair of bitlines interconnecting with the storage cells in a different column of the array;

a plurality of amplifiers, each amplifier connected with a separate pair of the complementary bitlines; and a circuit, responsive to the control signal, for disabling operation of the entire plurality of the amplifiers.

* * * * *